(12) United States Patent
Rada et al.

(10) Patent No.: US 9,316,714 B2
(45) Date of Patent: Apr. 19, 2016

(54) TEST STATION FOR WIRELESS DEVICES AND METHODS FOR CALIBRATION THEREOF

(71) Applicant: EMSCAN CORPORATION, Calgary (CA)

(72) Inventors: Patrick Rada, San Jose, CA (US); Ruska Patton, Calgary (CA)

(73) Assignee: EMSCAN CORPORATION, Calgary, Alberta (CA)

( * ) Notice: Subject to any disclaimer, the term of this patent is extended or adjusted under 35 U.S.C. 154(b) by 268 days.

(21) Appl. No.: 13/707,074

(22) Filed: Dec. 6, 2012

(65) Prior Publication Data

US 2013/0187674 A1    Jul. 25, 2013

Related U.S. Application Data

(60) Provisional application No. 61/567,461, filed on Dec. 6, 2011.

(51) Int. Cl.
| | |
|---|---|
| H04B 17/00 | (2015.01) |
| H04W 24/00 | (2009.01) |
| G01R 35/00 | (2006.01) |
| H04B 17/11 | (2015.01) |
| H04B 17/21 | (2015.01) |

(52) U.S. Cl.
CPC .............. *G01R 35/005* (2013.01); *H04B 17/11* (2015.01); *H04B 17/21* (2015.01)

(58) Field of Classification Search
CPC ........ H04B 17/00; H04B 17/11; H04B 17/21; H04B 17/0085; H04W 24/00; H04W 24/06
USPC ..................... 455/67.11, 67.14, 423, 424, 425
See application file for complete search history.

(56) References Cited

U.S. PATENT DOCUMENTS

| | | | |
|---|---|---|---|
| 7,672,640 B2 | 3/2010 | Nyshadham et al. | |
| 8,472,881 B2 * | 6/2013 | Scheucher | ................. 455/67.11 |
| 8,502,546 B2 | 8/2013 | Nyshadham et al. | |
| 8,706,046 B2 * | 4/2014 | Mellein | ....................... 455/67.14 |

* cited by examiner

*Primary Examiner* — Quochien B Vuong
(74) *Attorney, Agent, or Firm* — Bennett Jones LLP

(57) ABSTRACT

A test station for wireless devices and methods for calibration thereof. The test station includes a signal generator, a calibrator, a scanner having receiving and transmitting antennas, a signal analyzer, and a computer. Under the direction of the computer, the signal generator generates a calibration signal in accordance with a programmable calibration signal script. The calibrator may be used to emulate either a wireless device in transmit mode by transmitting the calibration signal to the scanner for analysis by the signal analyzer, or a wireless device in receive mode by receiving the calibration signal from the scanner for analysis by the signal analyzer. The behavior of the test station is calibrated by correlating signal parameters of the calibration signal as specified by the calibration signal script and as measured at the signal analyzer.

14 Claims, 35 Drawing Sheets

Self- Calibration of the Test Module (VSA/VSG)

- columns B to I are the specifications of the generated RF modulated signal for each frequency.
- columns J & K, the generated and measured signal from the VSG and VSA, respectively.
- column L is the computed calibrated VSA/VSG factor
- column M is the corrected signal after calibration

| B | C | D | E | F | G | H | I | J | K | L | M |
|---|---|---|---|---|---|---|---|---|---|---|---|
| | | | | | | | | | | Results | Results |
| test # | TX/RX | Channel | std | Mod. | MCS# | BW (MHz) | Rate (Mbps) | IQ2010 TX VSG (dBm) "-10dBm" | Actual Measured IQ2010 RX VSA (dBm) | IQ2010 Self Cal. factor (dB) | IQ2010 TX VSG after Self-Cal (dBm) |
| 1 | TX | 1 | 11b | QPSK-SS | NA | 20 | 2 | -10 | -10 | 0 | -10 |
| 2 | TX | 1 | 11g | QPSK-OFDM | NA | 20 | 6 | -10 | -9.8 | 0.2 | -10 |
| 3 | TX | 6 | 11n | 64QAM-OFDM | 7 | 40 | 135 | -10 | -10.2 | -0.2 | -10 |
| 4 | RX | 6 | 11n | BPSK-OFDM | 0 | 20 | 6.5 | N.A. | N.A. | N.A. | N.A. |
| 5 | TX | 11 | 11n | BPSK-OFDM | 1 | 20 | 6.5 | -10 | -9.8 | 0.2 | -10 |
| 6 | TX | 36 | 11a | BPSK-OFDM | NA | 20 | 6 | -10 | -10.4 | -0.4 | -10 |
| 7 | RX | 36 | 11n | 64QAM-OFDM | 7 | 20 | 65 | N.A. | N.A. | N.A. | N.A. |
| 8 | TX | 54 | 11a | 64QAM-OFDM | NA | 20 | 54 | -10 | -10.3 | -0.3 | -10 |
| 9 | TX | 64 | 11n | 64QAM-OFDM | 7 | 40 | 135 | -10 | -10.5 | -0.5 | -10 |
| 10 | TX | 120 | 11g | BPSK-OFDM | NA | 20 | 6 | -10 | -9.7 | 0.3 | -10 |
| 11 | TX | 165 | 11n | BPSK-OFDM | 1 | 20 | 6.5 | -10 | -9.7 | 0.3 | -10 |

Figure 12

Cal Cable #2+#3 step 1

A calibration of Cables #2 and 3 (path shown in Figure 13A) may be performed with the details below.

| test # | TX/RX | Channel | std | Mod. | MCS# | BW (MHz) | Rate (Mbps) | IQ2010 TX VSG RF2 after Self-Cal (dBm) | IQ2010 RX VSA RF1 Meas. (dBm) | Results IL P3-P2 (db) | Results IL23m=IL Cable #2 + Cable #3 (dB) |
|---|---|---|---|---|---|---|---|---|---|---|---|
| 1 | TX | 1 | 11b | QPSK-SS | NA | 20 | 2 | -10 | -13.25 | 0.25 | 3 |
| 2 | TX | 1 | 11g | QPSK-OFDM | NA | 20 | 6 | -10 | -13.29 | 0.25 | 3.04 |
| 3 | TX | 6 | 11n | 64QAM-OFDM | 7 | 40 | 135 | -10 | -13.49 | 0.27 | 3.22 |
| 4 | RX | 6 | 11n | BPSK-OFDM | 0 | 20 | 6.5 | N.A. | | NA | |
| 5 | TX | 11 | 11n | BPSK-OFDM | 1 | 20 | 6.5 | -10 | -13.76 | 0.31 | 3.45 |
| 6 | TX | 36 | 11a | BPSK-OFDM | NA | 20 | 6 | -10 | -15.2 | 0.39 | 4.81 |
| 7 | RX | 36 | 11n | 64QAM-OFDM | 7 | 20 | 65 | N.A. | | NA | |
| 8 | TX | 64 | 11a | 64QAM-OFDM | NA | 20 | 54 | -10 | -15.46 | 0.42 | 5.04 |
| 9 | TX | 64 | 11n | 64QAM-OFDM | 7 | 40 | 135 | -10 | -15.41 | 0.42 | 4.99 |
| 10 | TX | 120 | 11g | BPSK-OFDM | NA | 20 | 6 | -10 | -15.78 | 0.45 | 5.33 |
| 11 | TX | 165 | 11n | BPSK-OFDM | 1 | 20 | 6.5 | -10 | -15.92 | 0.47 | 5.45 |

Figure 13B

A calibration of Cable #3 (path shown in Figure 13C) may be performed with the details below.

Cal Cable #2+#3 step 2 (Cable #3)

| test # | TX/RX | Channel | std | Mod. | MCS# | BW (MHz) | Rate (Mbps) | IQ2010 TX VSG RF2 after Self-Cal (dBm) | Meas. RFXpert RX (dBm) | ILCable #3 +E (dB) Results |
|---|---|---|---|---|---|---|---|---|---|---|
| 1 | TX | 1 | 11b | QPSK-SS | NA | 20 | 2 | -10 | -12.4 | 2.4 |
| 2 | TX | 1 | 11g | QPSK-OFDM | NA | 20 | 6 | -10 | -12.3 | 2.3 |
| 3 | TX | 6 | 11n | 64QAM-OFDM | 7 | 40 | 135 | -10 | -12.5 | 2.5 |
| 4 | RX | 6 | 11n | BPSK-OFDM | 0 | 20 | 6.5 | N.A. | | |
| 5 | TX | 11 | 11n | BPSK-OFDM | 1 | 20 | 6.5 | -10 | -12.8 | 2.8 |
| 6 | TX | 36 | 11a | BPSK-OFDM | NA | 20 | 6 | -10 | -13.9 | 3.9 |
| 7 | RX | 36 | 11n | 64QAM-OFDM | 7 | 20 | 65 | N.A. | | |
| 8 | TX | 64 | 11a | 64QAM-OFDM | NA | 20 | 54 | -10 | -14.1 | 4.1 |
| 9 | TX | 64 | 11n | 64QAM-OFDM | 7 | 40 | 135 | -10 | -14 | 4 |
| 10 | TX | 120 | 11g | BPSK-OFDM | NA | 20 | 6 | -10 | -14.4 | 4.4 |
| 11 | TX | 165 | 11n | BPSK-OFDM | 1 | 20 | 6.5 | -10 | -14.9 | 4.9 |

Figure 13D

A calibration of Cable #2 (path shown in Figure 13E) may be performed with the details below.

Cal Cable #2+#3 step 3 (Cable #2 and computation)

| test # | TX/RX | Channel | std | Mod. | MCS# | BW (MHz) | Rate (Mbps) | IQ2010 TX VSG RF2 after Self-Cal (dBm) | Meas. RFXpert RX (dBm) | Results IL Cable #2 + E (dB) |
|---|---|---|---|---|---|---|---|---|---|---|
| 1 | TX | 1 | 11b | QPSK-SS | NA | 20 | 2 | -10 | -12.6 | 2.6 |
| 2 | TX | 1 | 11g | QPSK-OFDM | NA | 20 | 6 | -10 | -12.5 | 2.5 |
| 3 | TX | 6 | 11n | 64QAM-OFDM | 7 | 40 | 135 | -10 | -12.6 | 2.6 |
| 4 | RX | 6 | 11n | BPSK-OFDM | 0 | 20 | 6.5 | N.A. | | |
| 5 | TX | 11 | 11n | BPSK-OFDM | 1 | 20 | 6.5 | -10 | -13 | 3 |
| 6 | TX | 36 | 11a | BPSK-OFDM | NA | 20 | 6 | -10 | -14.2 | 4.2 |
| 7 | RX | 36 | 11a | 64QAM-OFDM | 7 | 20 | 65 | N.A. | | |
| 8 | TX | 64 | 11a | 64QAM-OFDM | NA | 20 | 54 | -10 | -14.2 | 4.2 |
| 9 | TX | 64 | 11n | 64QAM-OFDM | 7 | 40 | 135 | -10 | -14.4 | 4.4 |
| 10 | TX | 120 | 11g | BPSK-OFDM | NA | 20 | 6 | -10 | -14.5 | 4.5 |
| 11 | TX | 165 | 11n | BPSK-OFDM | 1 | 20 | 6.5 | -10 | -15.1 | 5.1 |

Figure 13F

Computation of individual insertion losses in cable #2 and cable #3

Cal Cable #2+#3 step 3 (Cable #2 and computation)

| test # | TX/RX | Channel | std | Mod. | MCS# | BW (MHz) | Rate (Mbps) | IQ2010 TX VSG RF2 after Self-Cal (dBm) | Meas. RFXpert RX (dBm) | Results IL Cable #2 + E (dB) | Results IL Cable (#3 - #2) (dB) | Results IL Cable #3 (dB) | Results IL Cable #2 (dB) |
|---|---|---|---|---|---|---|---|---|---|---|---|---|---|
| 1 | TX | 1 | 11b | QPSK-SS | NA | 20 | 2 | -10 | -12.6 | 2.6 | -0.2 | 1.4 | 1.6 |
| 2 | TX | 1 | 11g | QPSK-OFDM | NA | 20 | 6 | -10 | -12.5 | 2.5 | -0.2 | 1.42 | 1.62 |
| 3 | TX | 6 | 11n | 64QAM-OFDM | 7 | 40 | 135 | -10 | -12.6 | 2.6 | -0.1 | 1.56 | 1.66 |
| 4 | RX | 6 | 11n | BPSK-OFDM | 0 | 20 | 6.5 | N.A. | | | | | |
| 5 | TX | 11 | 11n | BPSK-OFDM | 1 | 20 | 6.5 | -10 | -13 | 3 | -0.2 | 1.625 | 1.825 |
| 6 | TX | 36 | 11a | BPSK-OFDM | NA | 20 | 6 | -10 | -14.2 | 4.2 | -0.3 | 2.255 | 2.555 |
| 7 | RX | 36 | 11n | 64QAM-OFDM | 7 | 20 | 65 | N.A. | | | | | |
| 8 | TX | 64 | 11a | 64QAM-OFDM | NA | 20 | 54 | -10 | -14.2 | 4.2 | -0.1 | 2.47 | 2.57 |
| 9 | TX | 64 | 11n | 64QAM-OFDM | 7 | 40 | 135 | -10 | -14.4 | 4.4 | -0.4 | 2.295 | 2.695 |
| 10 | TX | 120 | 11g | BPSK-OFDM | NA | 20 | 6 | -10 | -14.5 | 4.5 | -0.1 | 2.615 | 2.715 |
| 11 | TX | 165 | 11n | BPSK-OFDM | 1 | 20 | 6.5 | -10 | -15.1 | 5.1 | -0.2 | 2.625 | 2.825 |

Figure 13G

Computation of individual insertion losses in cable #1

Cal Cable #1

| test # | TX/RX | Channel | std | Mod. | MCS# | BW (MHz) | Rate (Mbps) | IQ2010 TX VSG RF2 after Self Cal (dBm) | Meas. IQ2010 RX VSA RF1 (dBm) | IL P3-P2 w/o PA (db) | IL P5-P2 (db) | IL P4-P5 (db) | Results IL Cable #1 (dB) |
|---|---|---|---|---|---|---|---|---|---|---|---|---|---|
| 1 | TX | 1 | 11b | QPSK-SS | NA | 20 | 2 | -10 | -15 | 0.82 | 0.32 | 0.13 | 0.73 |
| 2 | TX | 1 | 11g | QPSK-OFDM | NA | 20 | 6 | -10 | -15 | 0.8 | 0.31 | 0.13 | 0.72 |
| 3 | TX | 6 | 11n | 64QAM-OFDM | 7 | 40 | 135 | -10 | -15.3 | 0.85 | 0.35 | 0.15 | 0.73 |
| 4 | RX | 6 | 11n | BPSK-OFDM | 0 | 20 | 6.5 | N.A. | | | | | |
| 5 | TX | 11 | 11n | BPSK-OFDM | 1 | 20 | 6.5 | -10 | -15.7 | 0.91 | 0.36 | 0.15 | 0.83 |
| 6 | TX | 36 | 11a | 64QAM-OFDM | NA | 20 | 6 | -10 | -17.7 | 1.1 | 0.51 | 0.27 | 1.01 |
| 7 | RX | 36 | 11n | 64QAM-OFDM | 7 | 20 | 54 | N.A. | | | | | |
| 8 | TX | 64 | 11a | 64QAM-OFDM | NA | 20 | 54 | -10 | -18.1 | 1.16 | 0.61 | 0.3 | 0.99 |
| 9 | TX | 64 | 11n | 64QAM-OFDM | 7 | 40 | 135 | -10 | -18.3 | 1.2 | 0.65 | 0.3 | 1.16 |
| 10 | TX | 120 | 11g | BPSK-OFDM | NA | 20 | 6 | -10 | -18.8 | 1.3 | 0.71 | 0.32 | 1.14 |
| 11 | TX | 165 | 11n | BPSK-OFDM | 1 | 20 | 6.5 | -10 | -19.2 | 1.4 | 0.73 | 0.35 | 1.27 |

Figure 13I

Cal P3-P1 with Amplification chain

Computation of individual insertion losses in cable #1 with amplification chain P3-P1 including A3

| test # | TX/RX | Channel | std | Mod. | MCS# | BW (MHz) | Rate (Mbps) | IQ2010 TX VSG RF2 after Self Cal (dBm) | Meas. IQ2010 RX VSA RF1 (dBm) | IL P5*-P2 (db) | IL P4-P6 (db) | Results IL P3-P1 w/ PA (dB) |
|---|---|---|---|---|---|---|---|---|---|---|---|---|
| 1 | TX | 1 | 11b | QPSK-SS | NA | 20 | 2 | -10 | 13.8 | 0.32 | 0.13 | -27.98 |
| 2 | TX | 1 | 11g | QPSK-OFDM | NA | 20 | 6 | -10 | 13.8 | 0.31 | 0.13 | -28 |
| 3 | TX | 6 | 11n | 64QAM-OFDM | 7 | 40 | 135 | -10 | 13.5 | 0.35 | 0.15 | -27.95 |
| 4 | RX | 6 | 11n | BPSK-OFDM | 0 | 20 | 6.5 | N.A. | | | | |
| 5 | TX | 11 | 11n | BPSK-OFDM | 1 | 20 | 6.5 | -10 | 13.4 | 0.36 | 0.15 | -28.19 |
| 6 | TX | 36 | 11a | BPSK-OFDM | NA | 20 | 6 | -10 | 11 | 0.51 | 0.27 | -27.6 |
| 7 | RX | 36 | 11n | 64QAM-OFDM | 7 | 20 | 65 | N.A. | | | | |
| 8 | TX | 64 | 11a | 64QAM-OFDM | NA | 20 | 54 | -10 | 11.1 | 0.61 | 0.3 | -28.04 |
| 9 | TX | 64 | 11n | 64QAM-OFDM | 7 | 40 | 135 | -10 | 11 | 0.65 | 0.3 | -28.1 |
| 10 | TX | 120 | 11g | BPSK-OFDM | NA | 20 | 6 | -10 | 10.8 | 0.71 | 0.32 | -28.3 |
| 11 | TX | 165 | 11n | BPSK-OFDM | 1 | 20 | 6.5 | -10 | 10.7 | 0.73 | 0.35 | -28.5 |

Figure 13K

Wriss Cal in DUT TX w/ Calibrator and w/ A1

| test # | TX/RX | Channel | std | Mod. | MCS# | BW (MHz) | Rate (Mbps) | IQ2010 TX VSG RF2 after Self-Cal (dBm) | IL Cable #3 (dB) | IL P3-P1 w/ PA (dB) | IL Cable #1 (dB) | Calibrator self-cal P4-ERP (dB) | Calibrator ERP (dBm) | TX Sys cal Factor [dB] | Corrected IQ2010 TX RF2 (dBm) | Corrected Calibrator ERP (dBm) | Separation Factor (d,f) e.k. 4mm (dB) | Meas. IQ2010 RX VSA RF1 (dBm) | Wriss DUT_TX Cal Factor, EIRP-RF1 w/ A1 (dB) |
|---|---|---|---|---|---|---|---|---|---|---|---|---|---|---|---|---|---|---|---|
| 1 | TX | 1 | 11b | QPSK-SS | NA | 20 | 2 | -10 | 1.4 | -28.01 | 0.76 | -0.7 | 16.55 | 2.75 | -7.25 | 19.3 | 2.7 | 6.48 | 10.12 |
| 2 | TX | 1 | 11g | QPSK-OFDM | NA | 20 | 6 | -10 | 1.47 | -28.13 | 0.85 | -0.1 | 16.56 | 2.14 | -7.26 | 19.3 | 2.7 | 6.49 | 10.11 |
| 3 | TX | 6 | 11n | 64QAM-OFDM | 7 | 40 | 135 | -10 | 1.56 | -28.1 | 0.88 | 0.4 | 16.06 | 3.24 | 6.76 | 19.3 | 2.9 | 6.47 | 9.93 |
| 4 | RX | 6 | 11n | BPSK-OFDM | 0 | 20 | 6.5 | N.A. | | | | | | | | | | | |
| 5 | TX | 11 | 11n | BPSK-OFDM | 1 | 20 | 6.5 | -10 | 1.625 | -28.34 | 0.98 | 0.2 | 15.55 | 3.765 | -6.735 | 19.3 | 3.1 | 6.4 | 9.8 |
| 6 | TX | 36 | 11a | BPSK-OFDM | NA | 20 | 6 | -10 | 2.255 | -27.87 | 1.28 | 0.6 | 13.735 | 5.565 | 4.335 | 19.3 | 4.5 | 5.5 | 9.3 |
| 7 | RX | 36 | 11n | 64QAM-OFDM | 7 | 40 | 65 | N.A. | | | | | | | | | | | |
| 8 | TX | 64 | 11a | 64QAM-OFDM | NA | 20 | 54 | -10 | 2.47 | -28.34 | 1.29 | -0.4 | 14.98 | 4.32 | -5.68 | 19.3 | 4.8 | 5.1 | 9.4 |
| 9 | TX | 64 | 11n | 64QAM-OFDM | 7 | 40 | 135 | -10 | 2.295 | -28.4 | 1.46 | -0.4 | 15.045 | 4.255 | -5.745 | 19.3 | 4.8 | 5.1 | 9.4 |
| 10 | TX | 120 | 11g | BPSK-OFDM | NA | 20 | 6 | -10 | 2.615 | -28.62 | 1.46 | -1.1 | 15.645 | 3.655 | -6.345 | 19.3 | 5.1 | 4.8 | 9.4 |
| 11 | TX | 165 | 11n | BPSK-OFDM | 1 | 20 | 6.5 | -10 | 2.625 | -28.85 | 1.62 | -1.6 | 16.205 | 3.095 | -6.905 | 19.3 | 5.2 | 4.7 | 9.4 |

Figure 14B

Wriss Cal in DUT TX w/ Calibrator and w/ A1+A2

| test # | TX/RX | Channel | std | Mod. | MCS# | BW (MHz) | Rate (Mbps) | IQ2010 TX VSG RF2 after Self-Cal (dBm) | IL Cable #3 (dB) | IL P3-P1 w/ PA (dB) | IL Cable #1 (dB) | Calibrator self-cal P4-ERP (dB) | Calibrator ERP (dBm) | TX Sys cal Factor [dB] | Corrected IQ2010 TX RF2 (dBm) | Corrected Calibrator ERP (dBm) | Separation Factor (d,f) e.g. 4mm (dB) | Meas. IQ2010 RX VSA RF1 (dBm) | DUT_TX2 Cal Factor, EIRP-RF1 w/o A1+A2 (dB) |
|---|---|---|---|---|---|---|---|---|---|---|---|---|---|---|---|---|---|---|---|
| 1 | TX | 1 | 11b | QPSK-SS | NA | 20 | 2 | -10 | 1.4 | -28.01 | 0.76 | -0.7 | 16.55 | -7.25 | -17.25 | 9.3 | 2.7 | 10.98 | -4.38 |
| 2 | TX | 1 | 11g | QPSK-OFDM | NA | 20 | 6 | -10 | 1.42 | -28.13 | 0.85 | -0.7 | 16.56 | -7.26 | -17.26 | 9.3 | 2.7 | 10.98 | -4.38 |
| 3 | TX | 6 | 11n | 64QAM-OFDM | 7 | 40 | 135 | -10 | 1.56 | -28.1 | 0.88 | -0.4 | 16.06 | -6.76 | -16.76 | 9.3 | 2.9 | 10.78 | -4.38 |
| 4 | RX | 6 | 11n | BPSK-OFDM | 0 | 20 | 6.5 | N.A. | | | | | | | | | | | |
| 5 | TX | 11 | 11n | BPSK-OFDM | 1 | 20 | 6.5 | -10 | 1.625 | -28.34 | 0.98 | 0.2 | 15.535 | -6.235 | -16.235 | 9.3 | 3.1 | 10.98 | -4.38 |
| 6 | TX | 36 | 11a | BPSK-OFDM | NA | 20 | 6 | -10 | 2.255 | -27.87 | 1.28 | 0.6 | 13.735 | -4.435 | -14.435 | 9.3 | 4.5 | 8.98 | -4.18 |
| 7 | RX | 36 | 11n | 64QAM-OFDM | 7 | 40 | 65 | N.A. | | | | | | | | | | | |
| 8 | TX | 64 | 11a | 64QAM-OFDM | NA | 20 | 54 | -10 | 2.47 | -28.34 | 1.29 | -0.4 | 14.98 | -5.68 | -15.68 | 9.3 | 4.8 | 8.58 | -4.08 |
| 9 | TX | 64 | 11n | 64QAM-OFDM | 7 | 40 | 135 | -10 | 2.295 | -28.4 | 1.46 | -0.4 | 15.045 | -5.745 | -15.745 | 9.3 | 4.8 | 8.58 | -4.08 |
| 10 | TX | 120 | 11g | BPSK-OFDM | NA | 20 | 6 | -10 | 2.615 | -28.62 | 1.46 | -1.1 | 15.645 | -6.345 | -16.345 | 9.3 | 5.1 | 8.48 | -4.28 |
| 11 | TX | 165 | 11n | BPSK-OFDM | 1 | 20 | 6.5 | -10 | 2.625 | -28.85 | 1.62 | -1.6 | 16.205 | -6.905 | -16.905 | 9.3 | 5.2 | 8.38 | -4.28 |

Figure 14C

WrlssCal in DUT_RX w/ Calibrator and w/ A3

| test # | TX/RX | Channel | std | Mod. | MCS# | BW [MHz] | Rate [Mbps] | IQ2010TX VSG RF2 afterSelf-Cal (dBm) | RFxpert Plate EIRP (dBm) | Separation Factor (d,f) e.g. 4mm (dB) | Calibrator self-cal P4-EIRP (dB) | IL Cable #1 (dB) | IL P1-P2 thru SW9 (dB) | IL Cable #2 (dB) | Meas. IQ2010 RX VSA RF1 (dBm) | Wrlss DUT_RX Cal Factor, RF1-EIRP w/ A3 (dB) |
|---|---|---|---|---|---|---|---|---|---|---|---|---|---|---|---|---|
| 1 | TX | 1 | 11b | QPSK-SS | NA | 20 | 2 | -10 | -42.6 | 2.7 | -0.7 | 0.76 | 0.9 | 1.4 | -47.66 | 5.06 |
| 2 | TX | 1 | 11g | QPSK-OFDM | NA | 20 | 6 | -10 | -42.6 | 2.7 | -0.7 | 0.85 | 0.9 | 1.42 | -47.77 | 5.17 |
| 3 | TX | 6 | 11n | 64QAM-OFDM | 7 | 40 | 135 | -10 | -42.9 | 2.9 | -0.4 | 0.88 | 0.9 | 1.56 | -48.74 | 5.84 |
| 4 | RX | 6 | 11n | BPSK-OFDM | 0 | 20 | 6.5 | N.A. | | | | | | | | |
| 5 | TX | 11 | 11n | BPSK-OFDM | 1 | 20 | 6.5 | -10 | -43.7 | 3.1 | 0.2 | 0.93 | 0.9 | 1.625 | -50.505 | 6.805 |
| 6 | TX | 36 | 11a | BPSK-OFDM | NA | 20 | 6 | -10 | -44.9 | 4.5 | 0.6 | 1.28 | 1.4 | 2.255 | -54.935 | 10.035 |
| 7 | RX | 36 | 11n | 64QAM-OFDM | 7 | 20 | 65 | N.A. | | | | | | | | |
| 8 | TX | 64 | 11a | 64QAM-OFDM | NA | 20 | 54 | -10 | -45.5 | 4.8 | -0.4 | 1.29 | 1.3 | 2.47 | -54.96 | 9.46 |
| 9 | TX | 64 | 11n | 64QAM-OFDM | 7 | 40 | 135 | -10 | -45.6 | 4.8 | -0.4 | 1.46 | 1.5 | 2.295 | -55.255 | 9.655 |
| 10 | TX | 120 | 11g | BPSK-OFDM | NA | 20 | 6 | -10 | -45.9 | 5.1 | -1.1 | 1.46 | 1.5 | 2.615 | -55.475 | 9.575 |
| 11 | TX | 165 | 11n | BPSK-OFDM | 1 | 20 | 6.5 | -10 | -46.6 | 5.2 | -1.6 | 1.62 | 1.6 | 2.625 | -56.045 | 9.445 |

Figure 14E

TEST STATION FOR WIRELESS DEVICES AND METHODS FOR CALIBRATION THEREOF

FIELD OF THE INVENTION

The present invention is directed to a test station for wireless devices and methods for calibration thereof.

BACKGROUND

In the manufacturing process of wireless devices (e.g. cellular phones) that transmit and/or receive radio frequency (RF) signals, the wireless devices are tested at designated testing stations on the production line to ensure that the devices meet performance parameters regarding their transmit or receive functions. Conventional testing stations for wireless devices have fixtures configured to hold the device-under-test (DUT) in a specific position during testing, while probes make one or more conducted (wired) physical connection to the DUT. Passing devices are accepted and proceed to assembly and failing devices are rejected and repaired. Marginal units may be retested once or twice to confirm whether or not they pass. For maximum efficiency and profitability of the manufacturing process, the testing ideally consumes as little time as possible. This is especially important for original design manufacturers (ODMs) who rely on optimizing production times.

Reference wireless devices having known transmit or receive performance, commonly referred to as gold units (GUs), may be used to calibrate and verify the calibration of test stations. GUs may also be used to confirm test results for a DUT or deviations in DUT test results. For example, if two or more consecutive DUTs fail the test, the test can be run with a GU and the test results compared to diagnose a problem in the DUT production process, a defective component in the DUTs or inaccuracies in the test station. In order to verify the calibration of the test station with more granularity and to a desired level of thoroughness, it is useful to have a collection of GUs of varying standards such as "just good enough" GUs (i.e. units that should consistently pass the test at marginally acceptable limits) and "just bad enough" gold units (i.e. units that should consistently fail the test at marginally unacceptable limits).

The use of conventional test stations for wireless devices that require conducted connections to the DUT, and the associated use of GUs, possess several potential disadvantages. The need for physical connections between the test station and the DUT or GU typically requires the fixtures and probes of conventional testing stations to be specifically designed for, and therefore limited to use, with a particular DUT type (e.g. a specific make and model of cellular phone) or GU. Moreover, the DUT or GU may need to be precisely positioned within the test station by means of mechanical guides. Accordingly, a high level of effort, time and money is required to create DUT type-specific test stations and to reconfigure test stations for different DUT types. Among other things, new test fixtures and associated software may need to be installed in place of old test fixtures, tested, and calibrated. Testing rapidly becomes complex for MIMO DUTs having multiple inputs/multiple outputs. Physically connecting and disconnecting the DUT or the GU creates wear and tear on both the test station and the DUT or GU. Finally, it is difficult to create many GUs and maintain them to the level of desired performance. It is particularly difficult to create and maintain "just good enough" or "just bad enough" GUs to verify calibration at marginal pass or marginal fail limits, respectively.

Therefore, there is a need in the art for a system and method directed to calibration of test stations that mitigates the disadvantages of the prior art. Preferably the system and method will reduce the need for conducted physical connections between the test station and DUT and the need for dedicated GUs.

SUMMARY OF THE INVENTION

In one aspect, the present invention provides a method for calibrating a test station for testing a wireless device in transmit mode, the test station comprising a receiving antenna, a calibrator with a calibrator antenna, a signal generator, and a signal analyzer, the method comprising the steps of:
 (a) providing a signal path comprising a conducted path from the signal generator to the calibrator antenna, a wireless path from the calibrator antenna to the receiving antenna, and a conducted path from the scanner antenna to the signal analyzer;
 (b) providing a calibration signal script encoding for a calibration signal having a target transmit power level at the calibrator antenna;
 (c) using the signal generator to generate the calibration signal through the signal path;
 (d) using the signal analyzer to measure the power level of the calibration signal; and
 (e) correlating the target transmit power level of the calibration signal to the measured power level of the calibration signal.

In one embodiment, the calibration signal script additionally specifies one or more of the following parameters of the calibration signal: frequency; modulation and data rate; error vector magnitude; spectral mask and flatness; occupied bandwidth; phase noise; I-Q imbalance; clock frequency offset; center frequency leaking; or timing.

In another aspect, the invention may comprise a test station for testing a wireless device in transmit mode, the test station comprising:
 (a) a signal generator for generating a conducted calibration signal;
 (b) a calibrator comprising at least one calibrator antenna conductively connected to the signal generator for wirelessly transmitting the calibration signal;
 (c) a wireless scanner comprising a receiving antenna for wirelessly receiving the calibration signal;
 (d) a signal analyzer conductively connected to the receiving antenna for receiving and measuring the power level of the calibration signal;
 (e) a computer comprising:
  (i) a memory for storing a calibration signal file encoding for a target transmit power level of the calibration signal at the calibrator antenna, and a set of program instructions implementing the method described herein;
  (ii) a processor operatively connected to the memory, the signal generator, and the signal analyzer, the processor configured for executing the set of program instructions.

In one embodiment, the calibrator further comprises an enclosure for protecting the calibrator antenna, which is conductively connected to the signal generator via a calibrator signal path having:
 (a) a port that may be selectively conductively connected to the signal analyzer;

(b) a calibrator antenna switch for selectively connecting the calibrator antenna to and disconnecting the port from the calibrator signal path, or disconnecting the calibrator antenna from and connecting the port to the calibrator signal path.

In another aspect, the invention comprises a method for calibrating a test station for testing a wireless device in receive mode, the test station comprising a transmitting antenna, a calibrator with a calibrator antenna, a signal generator, and a signal analyzer, the method comprising the steps of:

(a) providing a signal path comprising a conducted path from the generator to the scanner antenna, a wireless path from the transmitting antenna to the calibrator antenna, and a conducted path from the calibrator antenna to the signal analyzer;

(b) providing a calibration signal script encoding for a calibration signal having a target receive power level and a corresponding target BER at the signal analyzer;

(c) using the signal generator to generate the calibration signal through the signal path;

(d) setting the power level of the calibration signal received at the signal analyzer to the target receive power level;

(e) measuring the BER of the calibration signal received at the signal analyzer;

(f) as necessary, varying the power level of the calibration signal generated by the signal generator to converge the measured BER to the target BER;

(g) correlating the target receive power level and the target BER to the power level of the calibration signal generated by the signal generator at which the measured BER converges to the target BER.

In yet another aspect, the invention may comprise a test station for testing a wireless device in receive mode, the test station comprising:

(a) a signal generator for generating a conducted calibration signal;

(b) a wireless scanner comprising a transmitting antenna conductively connected to the signal generator for wirelessly transmitting the calibration signal;

(c) a calibrator comprising at least one calibrator antenna for wirelessly receiving the calibration signal;

(d) a signal analyzer conductively connected to the calibrator antenna for receiving and measuring the power level of the calibration signal;

(e) a variably controllable generator amplifier or attenuator operatively connected to the signal generator for varying the amplitude of the calibration signal generated by the signal generator;

(f) a variably controllable analyzer amplifier or attenuator operatively connected to the signal analyzer for setting the amplitude the calibration signal received by the signal analyzer;

(g) a bit error detector operatively connected to the signal analyzer for measuring the BER of the calibration signal received by the signal analyzer;

(h) a computer comprising:

(i) a memory for storing a calibration signal file encoding for a target receive power level and a corresponding target BER of the calibration signal at the signal analyzer, and a set of program instructions implementing the method described in paragraph [0009] above ; and (ii) a processor operatively connected to the memory, the signal generator, the signal analyzer, the generator amplifier or attenuator, the analyzer amplifier or attenuator, and the bit error detector, the processor configured for executing the set of program instructions.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows:

FIG. 12 shows an example of self-calibration computations for the test station of the present invention.

FIGS. 13A to 13K show schematic circuit diagrams and accompanying examples of calibration computations for calibrating the test station of the present invention for signal power losses due to cable insertion effects.

FIGS. 14A to 14E show schematic circuit diagrams and accompanying examples of calibration computations for calibrating the test station of the present invention for conducted signal losses.

DETAILED DESCRIPTION OF PREFERRED EMBODIMENTS

The invention relates to a system and method for calibrating a test station for wireless devices. When describing the present invention, all terms not defined herein have their common art-recognized meanings. To the extent that the following description is of a specific embodiment or a particular use of the invention, it is intended to be illustrative only, and not limiting of the claimed invention. The following description is intended to cover all alternatives, modifications and equivalents that are included in the spirit and scope of the invention, as defined in the appended claims.

As used herein, a "wireless device" means any device which transmits, receives or both transmits and receives signals in the form of electromagnetic radiation (irrespective of power or range). Wireless devices may use configurations or protocols such as, but not limited to, cellular telephony, WiFi, WiMax, Bluetooth, Zigbee, or the like. In one embodiment, the wireless device comprises a cellular telephone with both Bluetooth and WiFi antennas.

As used herein, a "device-under-test" or "DUT" means a wireless device whose wireless transmit or receive functions, or both, are being tested by a wireless device test station.

Figure 1A:
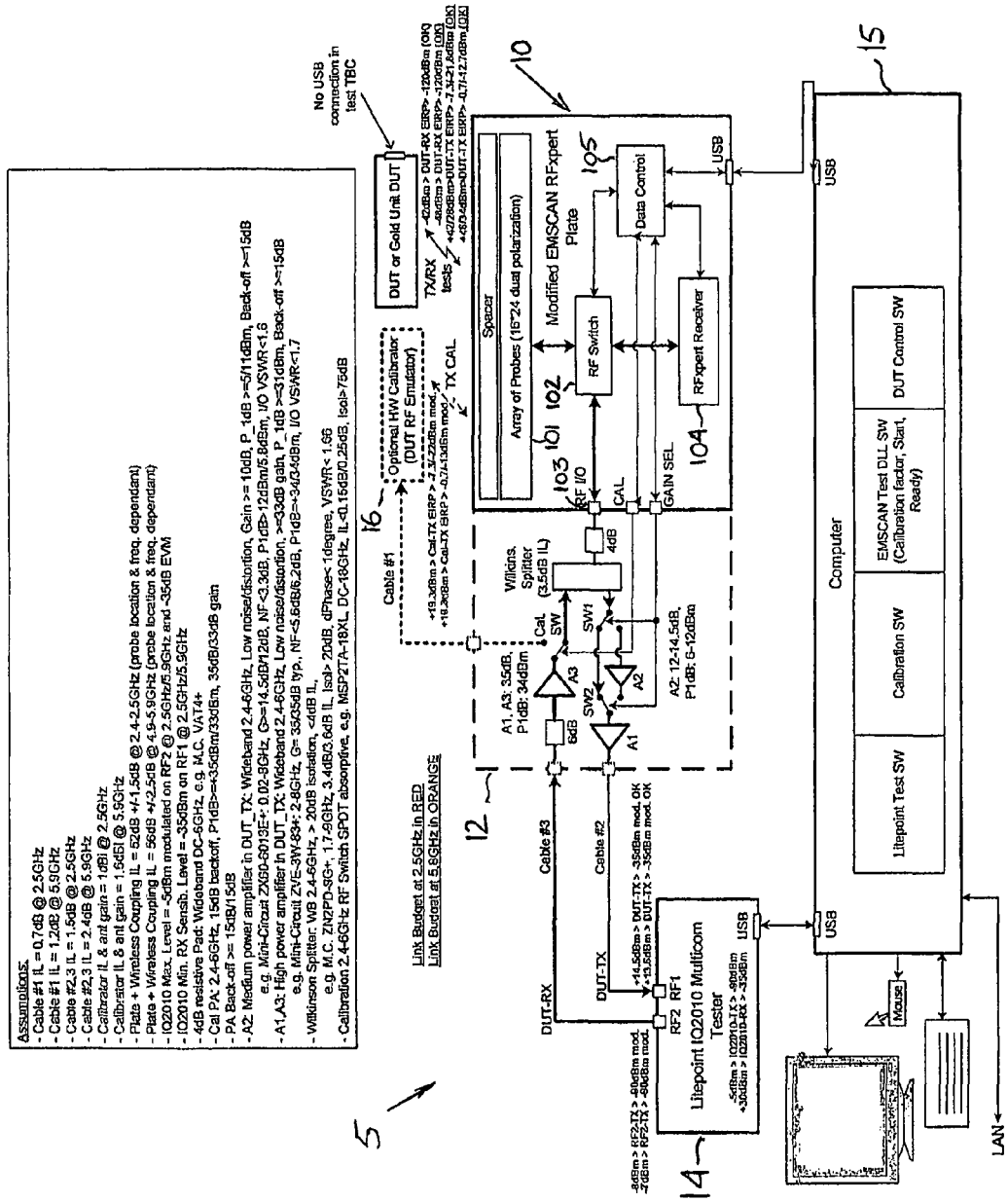
FIG. 1A shows a schematic diagram of one embodiment of a test station of the present invention.
Figure 1B:
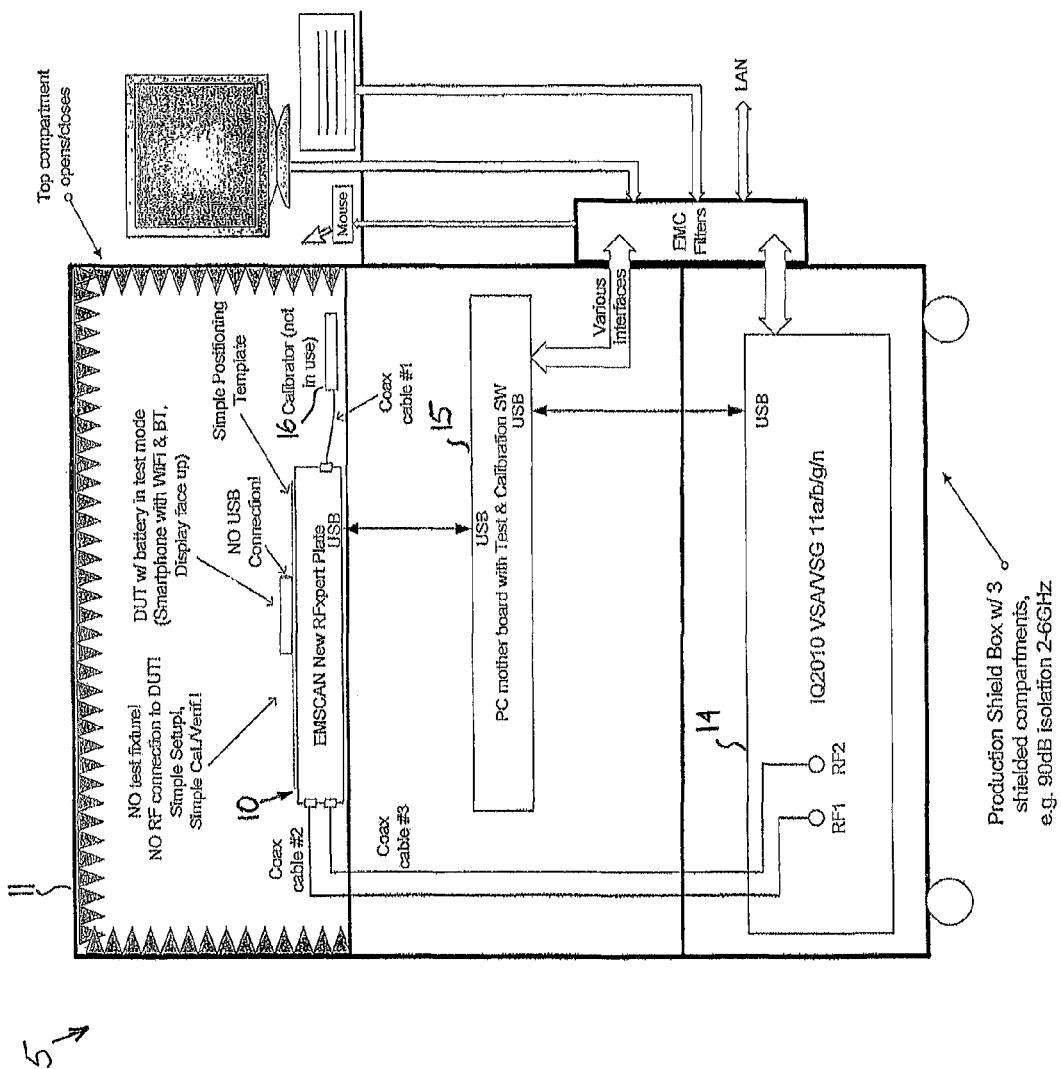
FIG. 1B shows a physical implementation of one embodiment of the test station shown in FIG. 1A.

In one aspect, the present invention provides a test station comprising a wireless calibrator. FIG. 1A and FIG. 1B show embodiments of a test station (5) of the present invention, which are now described. The station (5) comprises a scanner (10) comprising a receiving and/or transmitting antenna, or an array of receiving and/or transmitting antennas, an input/output module (12), a test module (14), a computer (15) running testing software, a calibrator (16), and an optional temperature sensor (not shown).

The scanner (10) antenna detects wireless signals emitted by DUTs, GUs or the calibrator (16). In one embodiment, the scanner (10) includes an array of antenna probes (101) which transmit and detect wireless signals, an RF switch (102) connected to an RF input/output port (103), a receiver (104) for receiving signals detected by the array of antenna probes (101), and a data control module (105) connected to the computer (15) by USB interface. The antenna probes (101) may radiate a wireless signal as generated by the computer (15) or by the test module (14). The scanner (10) may be enclosed in a shield box or shield room (11) impervious to electromagnetic radiation, but a shield box or shield room is not necessary if, for example, external electromagnetic radiation levels are sufficiently low as to not affect any testing results. In one embodiment, the scanner (10) is a near-field scanner (10), such as, by way of non-limiting example, an RFxpert™ scanner plate (Emscan Corp., Calgary, Alberta) or that described in Applicant's U.S. Pat. No. 7,672,640, entitled "Multichannel Absorberless Near Field Measurement System" and co-pending application number 2007/0285322, the entire contents of which are incorporated herein by reference, where permitted.

The input/output module (12) acts as an interface for conducted signals between the test module (14) and the scanner (10), and between the test module (14) and the calibrator (16). In one embodiment, as shown in FIGS. 1A and 1B, these conducted signals are transmitted by way of coaxial cables #2 and #3 and SMA connectors between test module (14) and input/output module (12), and a coaxial cable #1 and SMA connector between the test module (14) and the calibrator (16). Cables #1, #2 and #3 can be made of one cable or several cables connected in series. The input/output module (12) preferably comprises one or more low noise, low distortion power amplifiers (A1) so that the scanner (10) or the calibrator (16), can emit wireless signals at levels comparable to those transmitted by a DUT (as will be discussed below).

The test module (14) comprises a signal generator to generate conducted signals and a signal analyzer to receive conducted signals. The test module (14) is operatively connected to a computer (15) via a standard USB. The test module (14) may comprise a device such as, by way of non-limiting example, a LitePoint IQ2010™ tester (LitePoint Corporation, CA, USA) having a vector signal generator (VSG) for the signal generator and a vector signal analyzer (VSA) for the signal analyzer. A typical VSA analyzes the physical layer integrity of a signal by parameters such as power level, error vector magnitude (EVM), occupied bandwidth (OBW), spectral mask, residual center frequency leakage, subcarriers, frequency offset, and similar parameters known to those skilled in the art.

The computer (15) has a memory for storing calibration and testing software, and calibration signal scripts, and further has a processor to execute the calibration and testing software. The computer (15) is operatively connected to the VSG, the VSA, the scanner (10), and may be further connected to the calibrator (16) by the USB interfaces.

The calibrator (16) may emulate a GU in transmit-mode by transmitting wireless signals generated by the VSG, under the direction of the computer (15), to the scanner (10) for conducted transmission to the VSA. Alternatively, the calibrator (16) may emulate a GU in receive-mode by receiving wireless signals from transmitted by scanner (10), which are generated by the VSG, under the direction the computer (15), and conducting them to the VSA. The calibrator (16) in conjunction with the system can (within the technical limits of the components) be used to emulate any type DUT type or GU of any standard (e.g. "good", "bad", "just good enough", or "just bad enough", etc.) because the signals to be transmitted or received by the calibrator (16) are generated by the VSG under the direction of the computer (15) and the signal parameters may be programmed at will of the user.

Figure 3A:
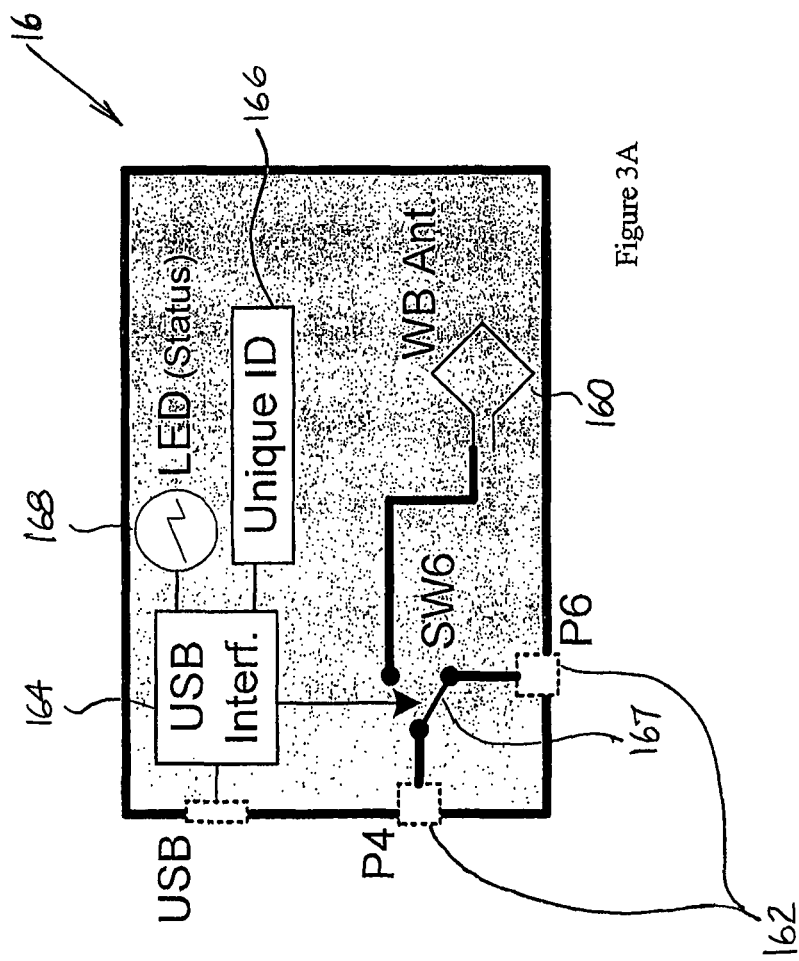
FIG. 3A shows a schematic diagram of one embodiment of a calibrator of the present invention.

FIG. 3A shows a schematic of one embodiment of the calibrator (16). The calibrator (16) comprises a calibrator antenna (160) which can be conductively connected to the input/output module (12) via port P4 via a printed circuit board. The calibrator antenna (160) transmits and receives wireless signals over different frequencies. For example, the frequencies may comprise WLAN 2.4 and 5 GHz bands, and 802.11b, g, a and n, with 20 MHz and 40 MHz bandwidth. In one embodiment, the calibrator antenna (160) is a dual band antenna (160). The dual-band antenna (160) is preferably a balanced antenna, which is less susceptible to close proximity ground plane, components, and pickup noise, and is more omni-directional, than a single-band antenna. The calibrator (16) may further comprise port P6, switch SW6, USB interface (164), calibrator storage (166) and indicator (168). Port P6 may selectively be connected to or disconnected from the input/output module (12) via port P5*. Under the direction of the computer (15), the USB interface (164) selectively switches switch SW6 to conductively connect either the calibrator antenna (160) or port P6 to port P4. The USB interface (164) also controls indicator (168) to show the connection status of the calibrator (e.g. whether port P6 is connected to port P5*) and the signal transmission status of the calibrator (16) (e.g. whether the calibrator (16) is transmitting or receiving a wireless signal). In one embodiment, the indicator (168) is a multi-colored LED. The storage (166) may be used to store a set of software instructions to control tests, signal parameters for calibrating the system, and a unique identifier to select the right calibration file and avoid confusion.

Figure 3B:
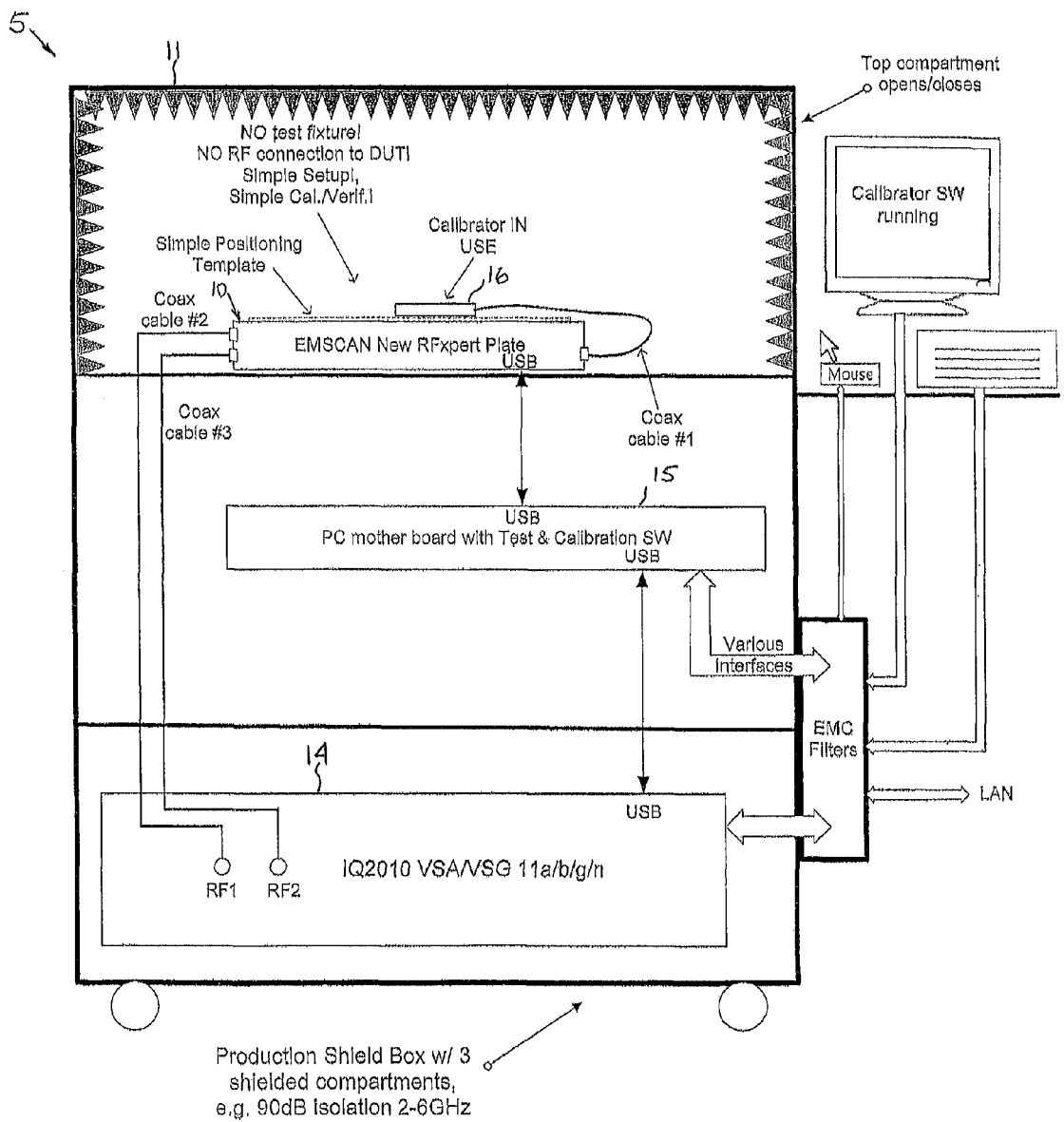
FIG. 3B shows a schematic diagram of the test station of FIG. 1B, with the calibrator in use as a GU emulator.
Figure 4:
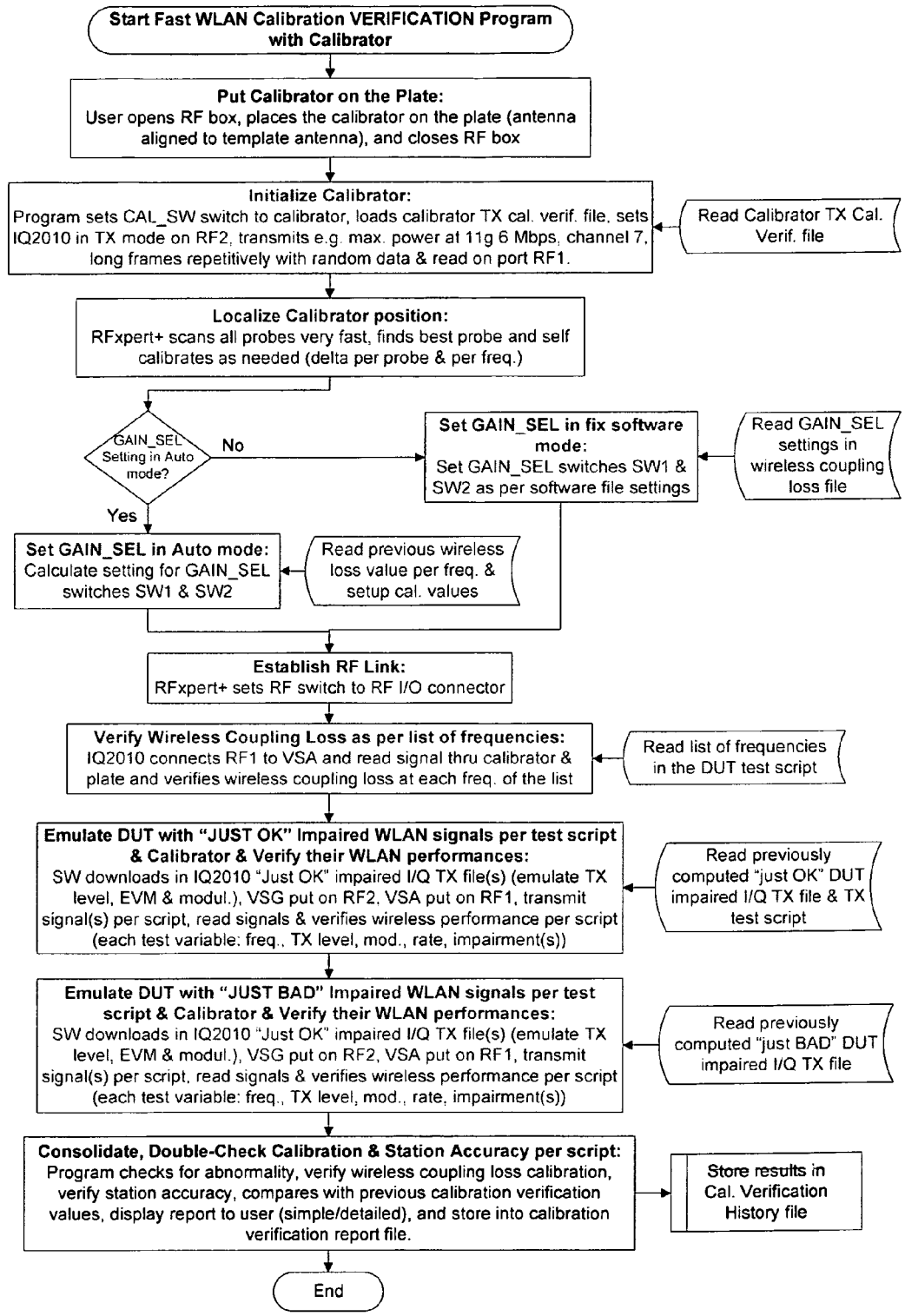
FIG. 4 shows a schematic flowchart of one embodiment a method for calibrating the test station of the present invention for a DUT in transmit mode.

FIG. 3B shows one embodiment of the calibrator (16) physically connected to the input/output module (12) via coaxial cable #1. The calibrator may comprise a plastic case enclosing the calibrator antenna (16), which has a size approximately equal to that of a typical cellular telephone. The location of the antenna (16) within the case may be marked externally on the case to facilitate proper placement of the calibrator (16) on the scanner (10). Preferably, the calibrator (16) stays connected so that calibration of the station (5) can be done quickly and conveniently, even during production, without additional wear and tear on the station (5).

In one embodiment, the system further comprises a temperature sensor (not shown) operatively connected to the computer, which is used to monitor changes in temperature of components of the system (5) that have performance characteristics that are affected by temperature changes. More granularity may be achieved by providing separate temperature sensors in different areas of the station (5).

Figure 5:
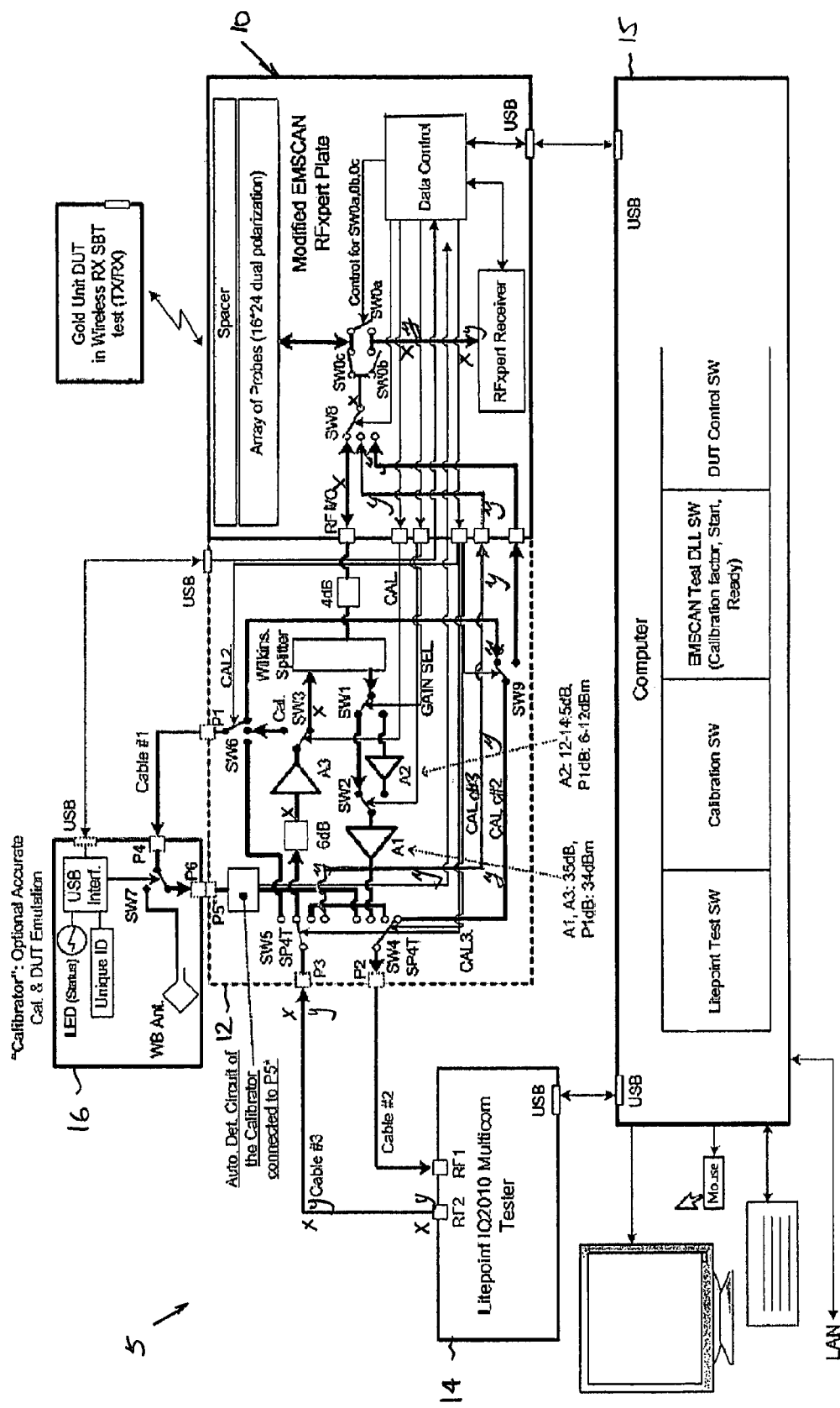
FIG. 5 shows a schematic circuit diagram of one embodiment of the test station of the present invention, when used to calibrate the test station for temperature effects.

One embodiment of the use and operation of station (5) is now described by way of example, in reference to the embodiment of the system shown in FIG. 5, and the following stages:

Stage A: preparation of calibration signal files;
Stage B: (optional) self-calibration of the test module (14);
Stage C: calibration of the station (5) for cable insertion losses and conducted losses;
Stage D: calibration of the station (5) for combined conducted and wireless signal losses for the DUT in transmit and receive modes;
Stage E: (optional) calibration of the station (5) for temperature effects;
Stage F: (optional) calibration of the station (5) with a GU;
Stage G: (optional) calibration of the station (5) using the calibrator (16) as a GU emulator; and
Stage H: DUT testing.

The following examples are provided to illustrate exemplary embodiments of the invention only, and not to limit the claimed invention.

Figure 9:
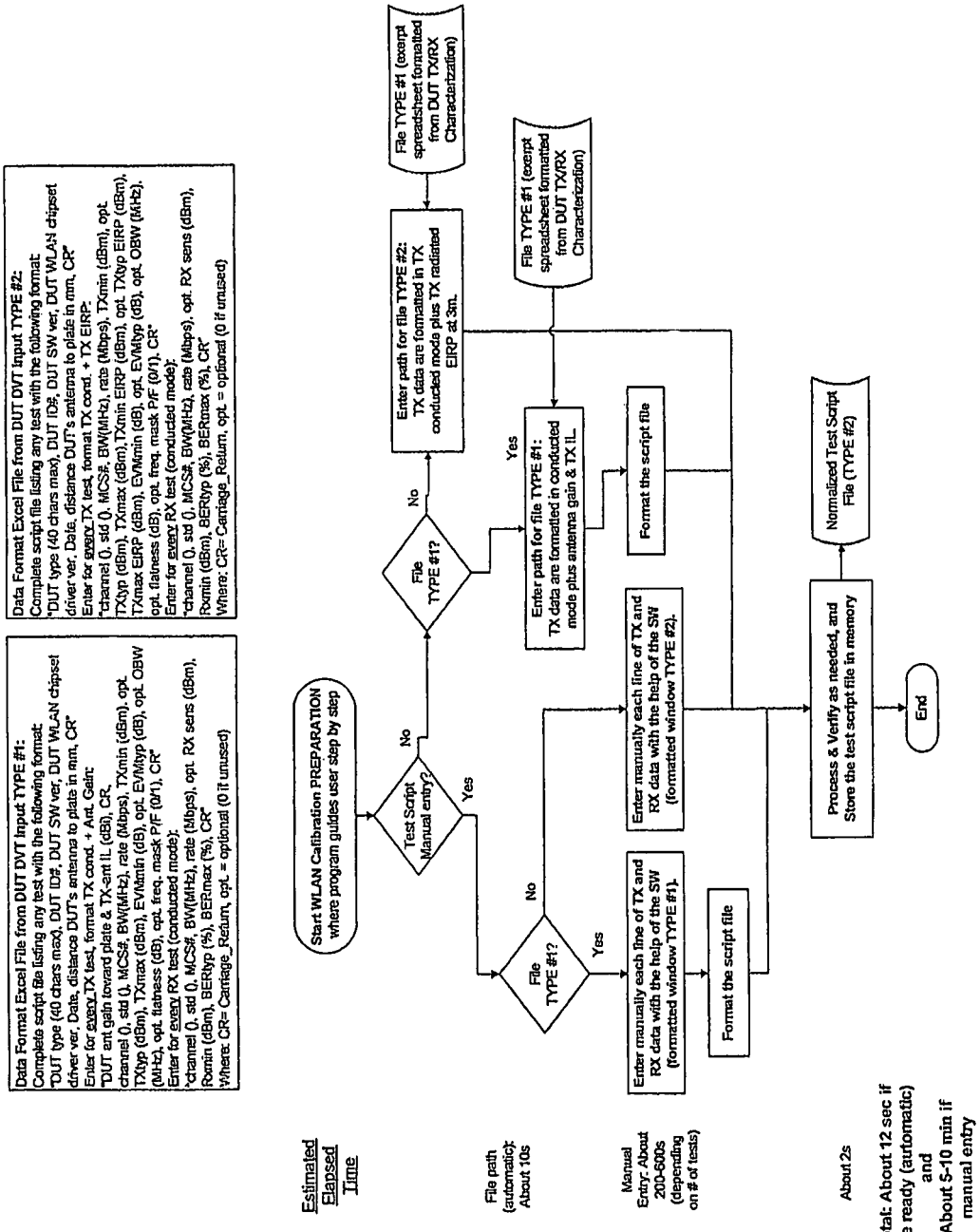
FIG. 9 shows a flowchart of a method for preparing a calibration signal file.

Stage A: Preparation of Calibration Signal Scripts. The calibration signal scripts encode information about signal parameters for calibration signals to be generated in the subsequent calibration stages. FIG. 9 shows an exemplary process for preparing calibration signal scripts. The calibration signal scripts may be generated manually or automatically, in the form of a spreadsheet, and subsequently stored in the memory of the computer (15) or the memory (166) of the calibrator (16). For example, as further discussed below, when the calibrator (16) is used to emulate a GU in the transmit mode, the calibration script may contain information about the power level of the calibration signal to be radiated by the calibrator antenna (16). When the calibrator (16) is used to emulate a GU in the receive mode, the calibration script may contain information about the target sensitivity level and target BER of the GU. Other signal parameters that may be encoded include: (a) transmit level per frequency; (b) modulation and data rate, (c) associated signal integrity as measured by error vector magnitude (EVM) parameter; (d) spectral mask and flatness; (e) occupied bandwidth (OBW); (f) phase noise and IQ-imbalance; (g) clock frequency offset; and (h) center frequency leakage. The calibration script files may also encode identifying information about the DUT or test setup such as DUT type, identification number, software version, WLAN chipset driver version, date, distance to scanner plate.

Once the calibration signal scripts have been prepared, the calibration stages may proceed. FIGS. 11A through 11D show one embodiment of the calibration stages for use with the embodiment of the station (5) shown in FIG. 5. The calibration stages begin with the computer (15) reading the prepared calibration signal scripts (step 1101). In a preferred embodiment, the calibration stages are performed once per DUT type, with minimal hardware and cable manual handling. It will be appreciated that all of the calibration stages may be automated under the direction of the computer (15) to control the various components and store the information, with minimal need for the user to handle the station (5) or perform any computations.

Figure 11A:
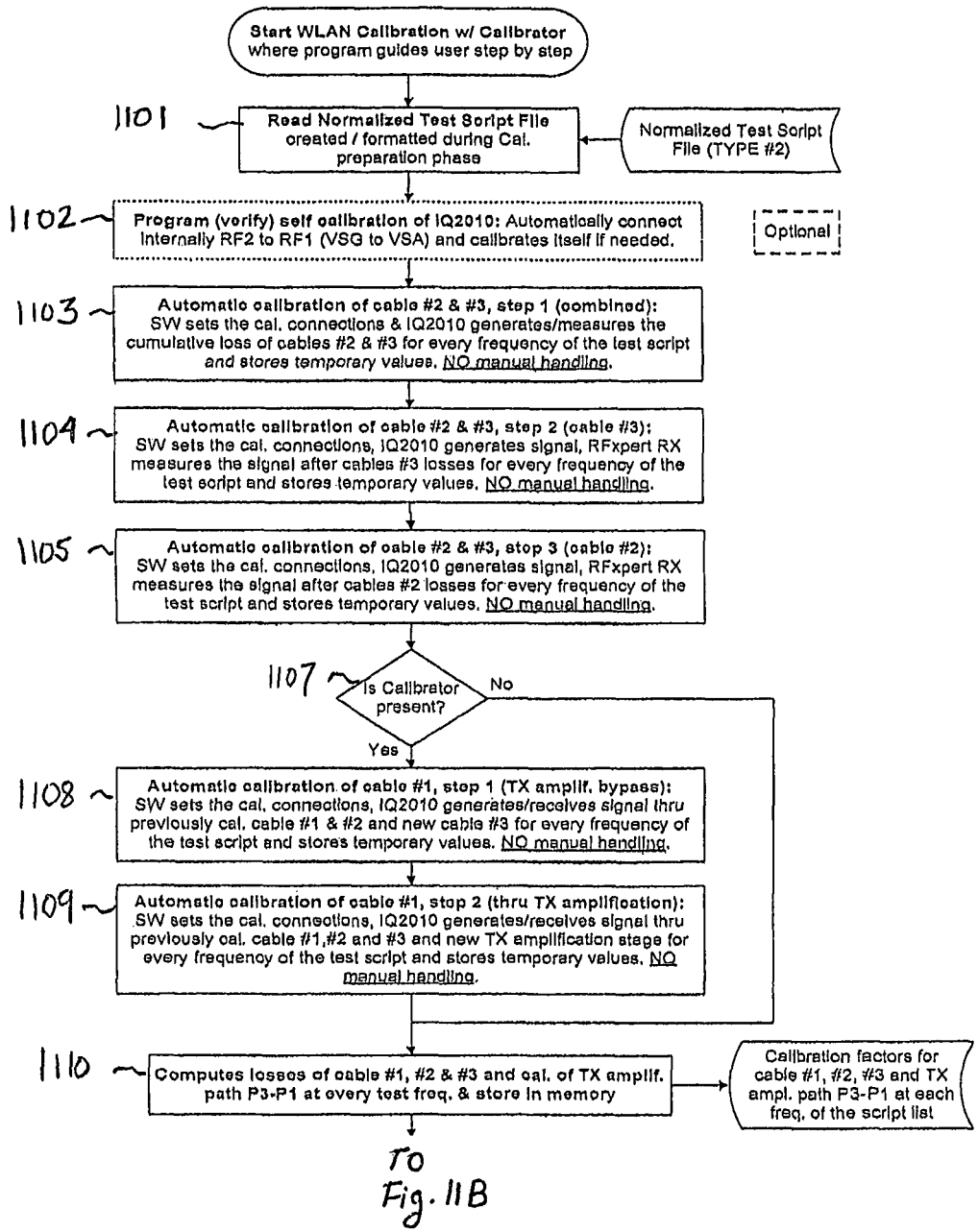
FIGS. 11A to 11D shows a flowchart of one embodiment of methods for calibrating one embodiment of the test station of the present invention.

Stage B: (Optional) Self-Calibration of the Test Module (14). The calibration of the test module (14) is verified (FIG. 11A: step 1102). The VSG is conductively connected to the VSA using only signal paths internal to the test module (14). The VSG generates signals in accordance with the calibration test script. FIG. 12 shows an example of the test module self-calibration computations. A self-calibration factor (column L) is computed as the difference between the power level of the signals as generated by the VSG (column J) and as received by the VSA (column K). This self-calibration factor is stored and accounted for in the subsequent calibration stages by adding it to the power level of signals to be generated by the VSG.

Stage C: Calibration of the Station (5) for Cable Insertion Losses. The station (5) is calibrated for cable insertion losses owing to cables #1, #2 and #3 (FIG. 11A: steps 1103-1110). In general, this is achieved by sequentially creating a variety of conducted signal paths from the VSG through the cables to the VSA, using the VSG to generate signals of known power levels according to the calibration signal scripts through those paths, using the VSA to measure the power level of the signal at the end of the signal path, and computing the difference in power level of the signal at the VSG and at the VSA after accounting for other known power losses. As described below, the calibrator (16) is used to create portions of the conducted signal path.

Figure 13A:
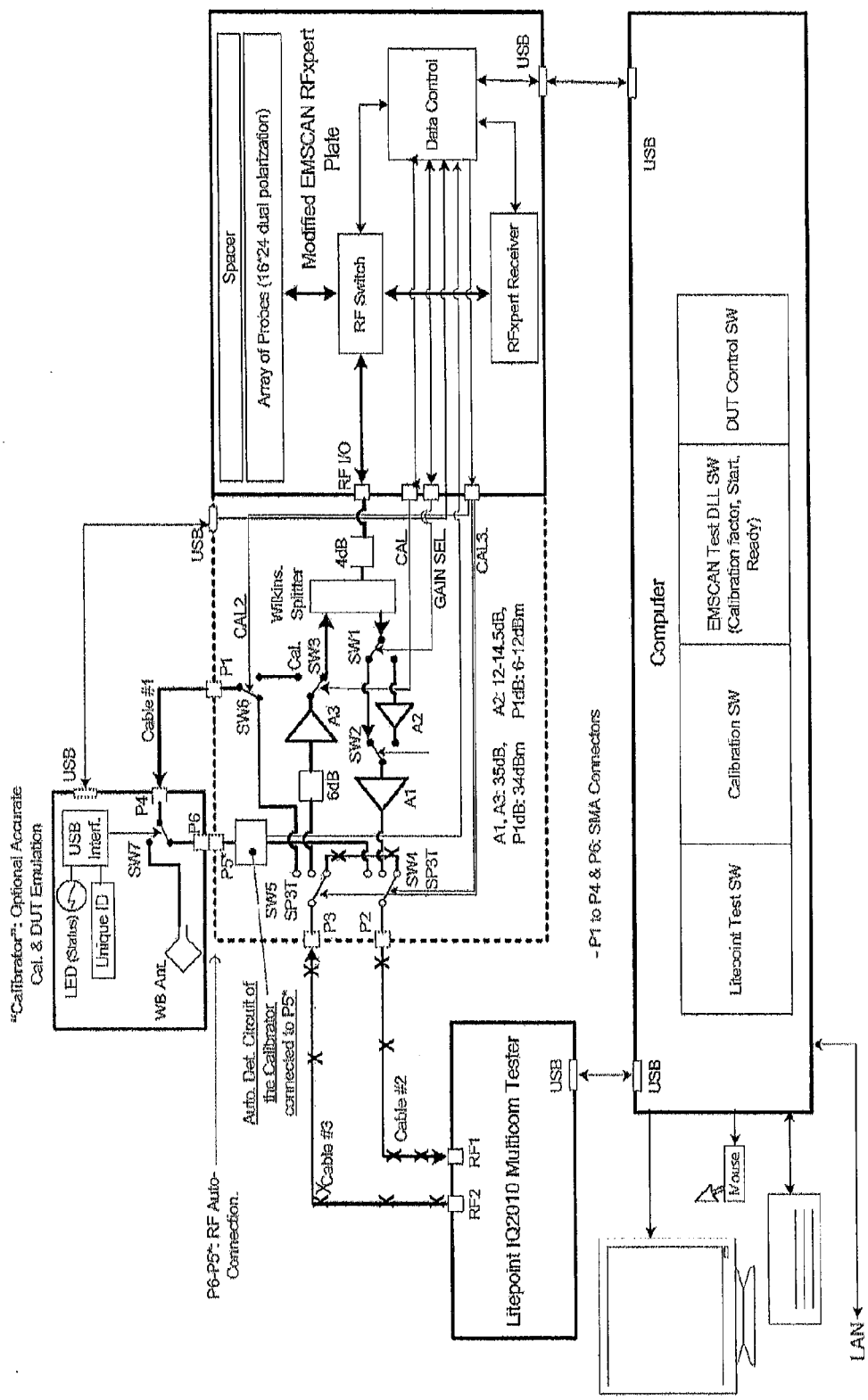

The combined insertion losses for cable #2 and cable #3 are determined (step 1103). The computer (15) switches the connections to create a signal path through both cables #2 and #3 as highlighted by "x"s in FIG. 13A. The VSG generates signals according to the calibration signal script. The signals are received by the VSA, measured and temporarily stored. FIG. 13B exemplifies the computation of cable insertion loss for cables #2 and #3 in combination, $IL_{23m}(f)$, (in all equations, the variable f, is the frequency of the signal) in accordance with the below equation (step 1110):

$$IL_{23m}(f) = L_{VSG}(f) - L_{VSA}(f) - IL_{P3-P2}(f) \qquad \text{(eq. 1)}$$

where:
$L_{VSG}(f)$: level of programmed calibrated signal transmitted by the VSG in (dB)
$L_{VSA}(f)$: level of measured signal received by the VSA in (dB)
$IL_{P3-P2}(f)$: previously measured factory calibration of the insertion loss from port P3 to P2 at various frequencies in (dB).

As used herein, all levels (L) are given in dB and referred to a milliwatt (dBm).

Figure 13C:
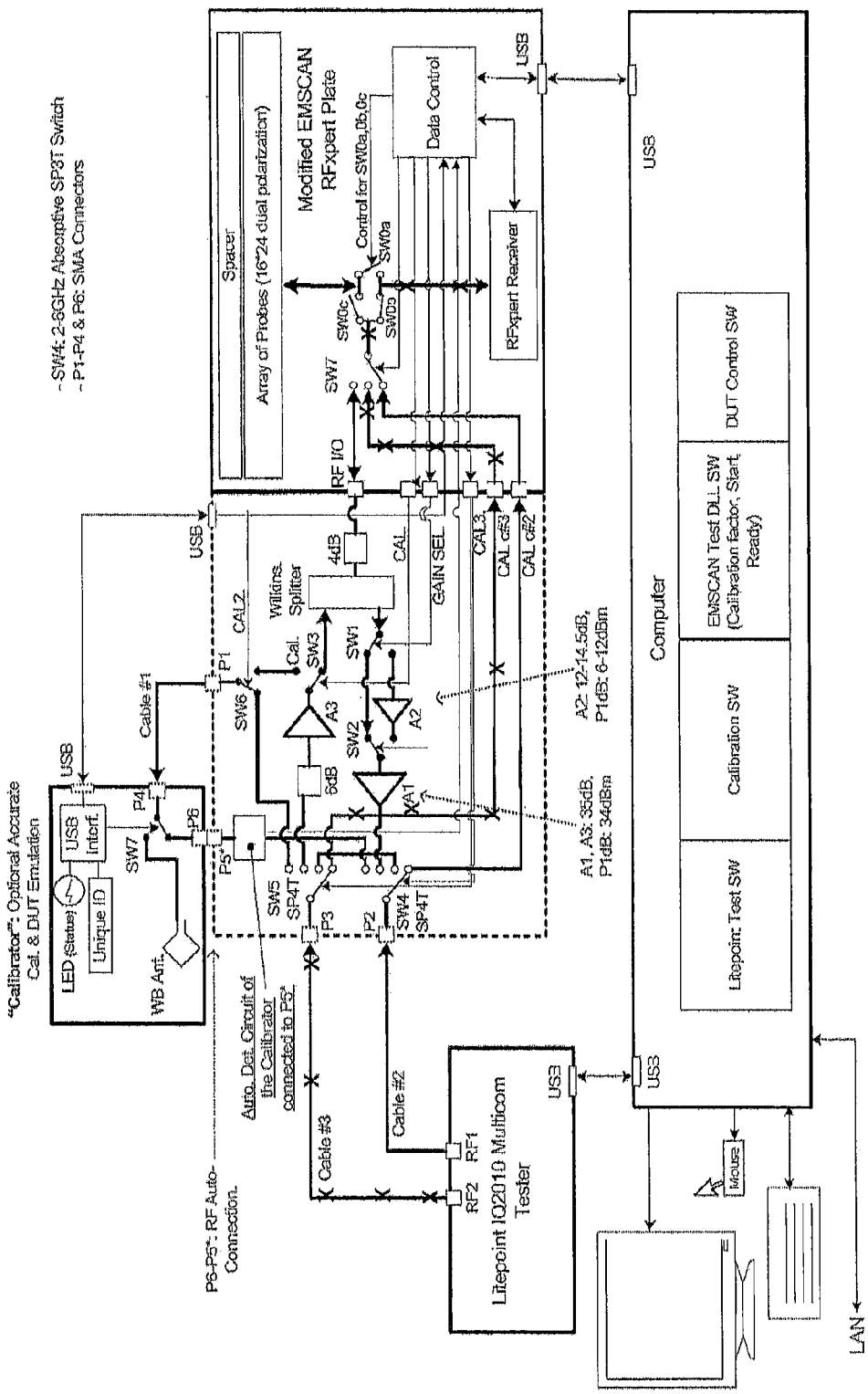

Next, the approximate insertion loss for cable #3 is determined (step 1104). The computer (15) switches the connections to create a signal path through cable #3 (but not cable #2) as highlighted by "x"s in FIG. 13C. The VSG generates signals through the signal path according to the calibration signal script. The signals are received by the scanner (10), measured, and temporarily stored. FIG. 13D exemplifies the computation of the approximate insertion loss for cable #3, $IL_{3m}(f) + \epsilon(f)$ in accordance with the below equation (step 1110):

$$IL_{3m}(f) + \epsilon(f) = L_{VSG}(f) - L_{RFxRX}(f) \qquad \text{(eq. 2)}$$

where:
$L_{VSG}(f)$: level of programmed calibrated signal transmitted by the VSG in (dB);

$L_{RFxRX}(f)$ level of measured signal received by the scanner (10) in (dB).

Figure 13E:
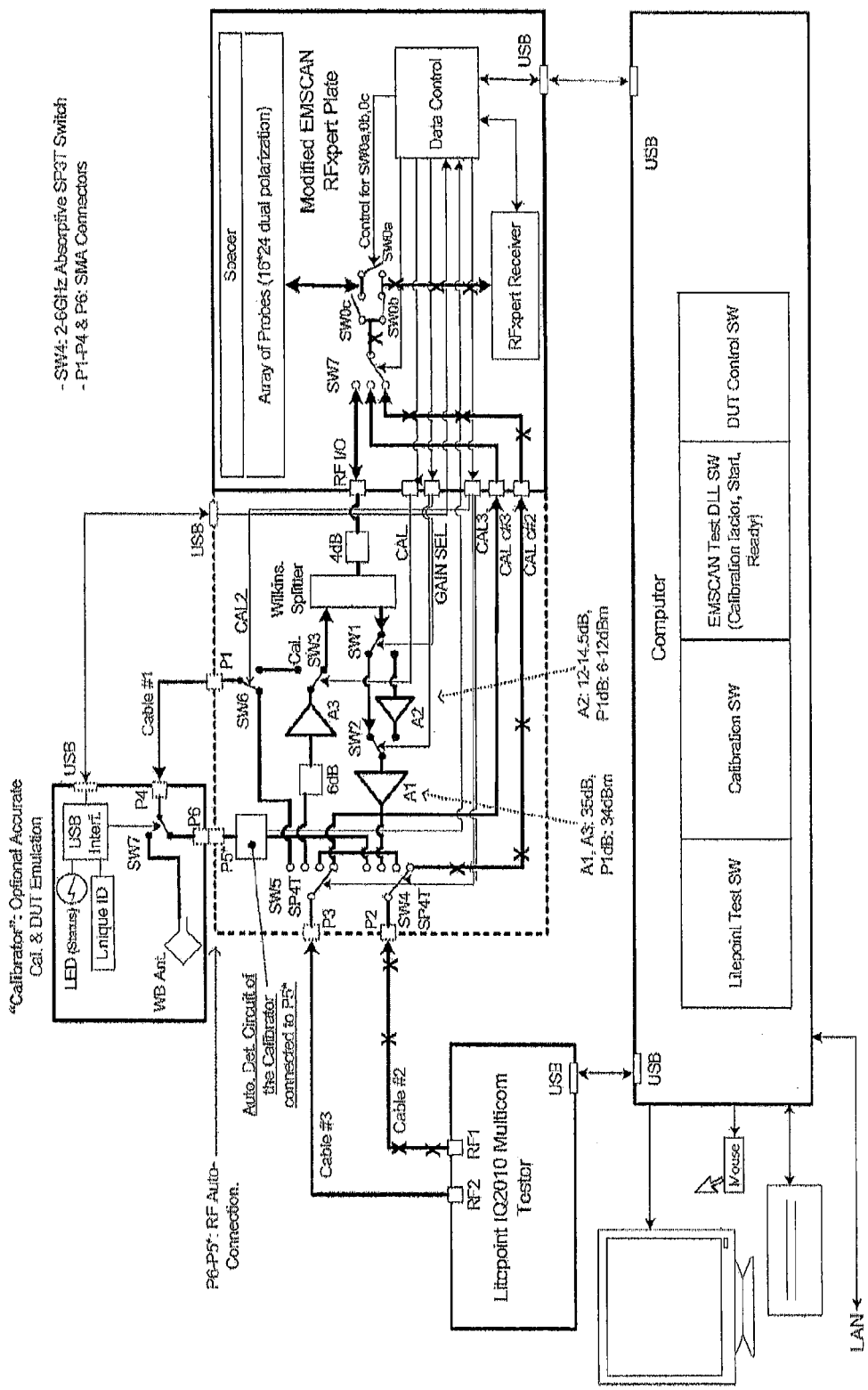

Next, the approximate insertion loss for cable #2 is determined (step 1105). The computer (15) switches the connections to create a signal path through cable #2 (but not cable #3) via as highlighted by "x"s in FIG. 13E. The VSG generates signals through the signal path according to the calibration signal script. The signals are received by the scanner (10), measured and temporarily stored. FIG. 13F exemplifies the computation of the approximate insertion loss value for cable #2, $IL_{2m}(f)+\epsilon(f)$, in accordance with the below equation (step 1110):

$$IL_{2m}(f)+\epsilon(f)=L_{VSG}(f)-L_{RFxRX2m}(f) \quad \text{(eq. 3)}$$

where:

$L_{VSG}(f)$: level of programmed calibrated signal transmitted by the VSG in (dB);

$L_{RFxRX2m}(f)$: level of measured signal received by the scanner (10) in (dB).

Based on the foregoing determinations of the quantities, $IL_{23m}(f)$, $IL_{2m}(f)+\epsilon(f)$, and $IL_{3m}(f)+\epsilon(f)$, the insertion losses in cable #2, $IL_{Cable\#2}(f)$, and in cable #3, $IL_{Cable\#3}(f)$, are more accurately calculated FIG. 13G exemplifies the computation of these quantities through the solution of the following equations which "zero out" any potential inaccuracies or frequency variations in the sensor (10) (step 1110):

$$IL_{Cable\#3}(f)+IL_{Cable\#2}(f)=IL_{23m}(f) \quad \text{(eq. 4)}$$

$$IL_{Cable\#3}(f)-IL_{Cable\#2}(f)=[IL_{3m}(f)+\epsilon(f)]-[IL_{2m}(f)+\epsilon(f)] \quad \text{(eq. 5)}$$

Figure 10:
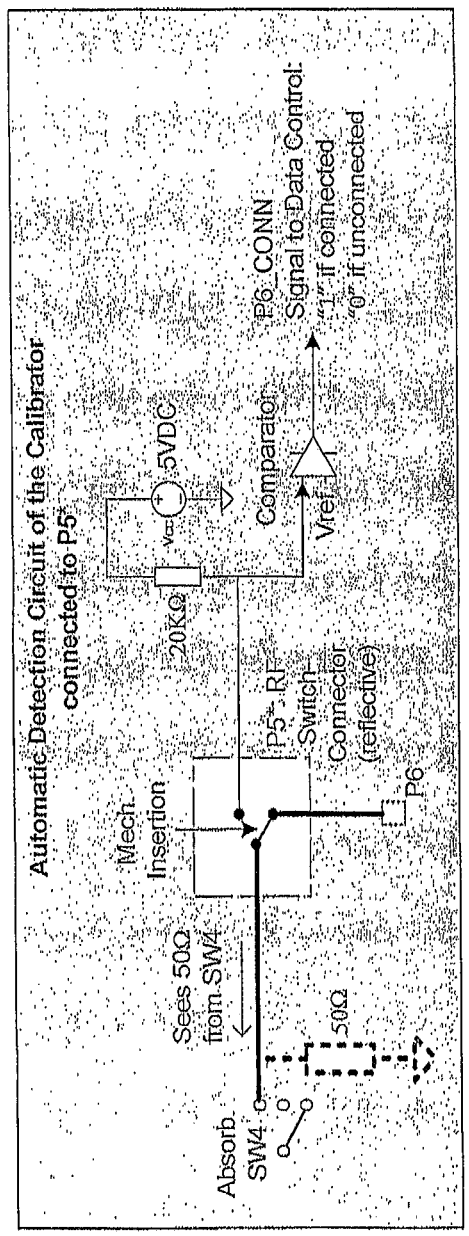
FIG. 10 shows a schematic circuit diagram of an automatic detection circuit for one embodiment of the calibrator of the present invention.

Next, the calibrator (16) is connected to the input/output module (12) via ports P5* and P6 in preparation for calculating the cable insertion loss for cable #1. The station (5) automatically checks if the calibrator (16) is connected at ports P5*-P6 (step 1107) using an automatic detection circuit as shown in FIG. 10.

Figure 13H:
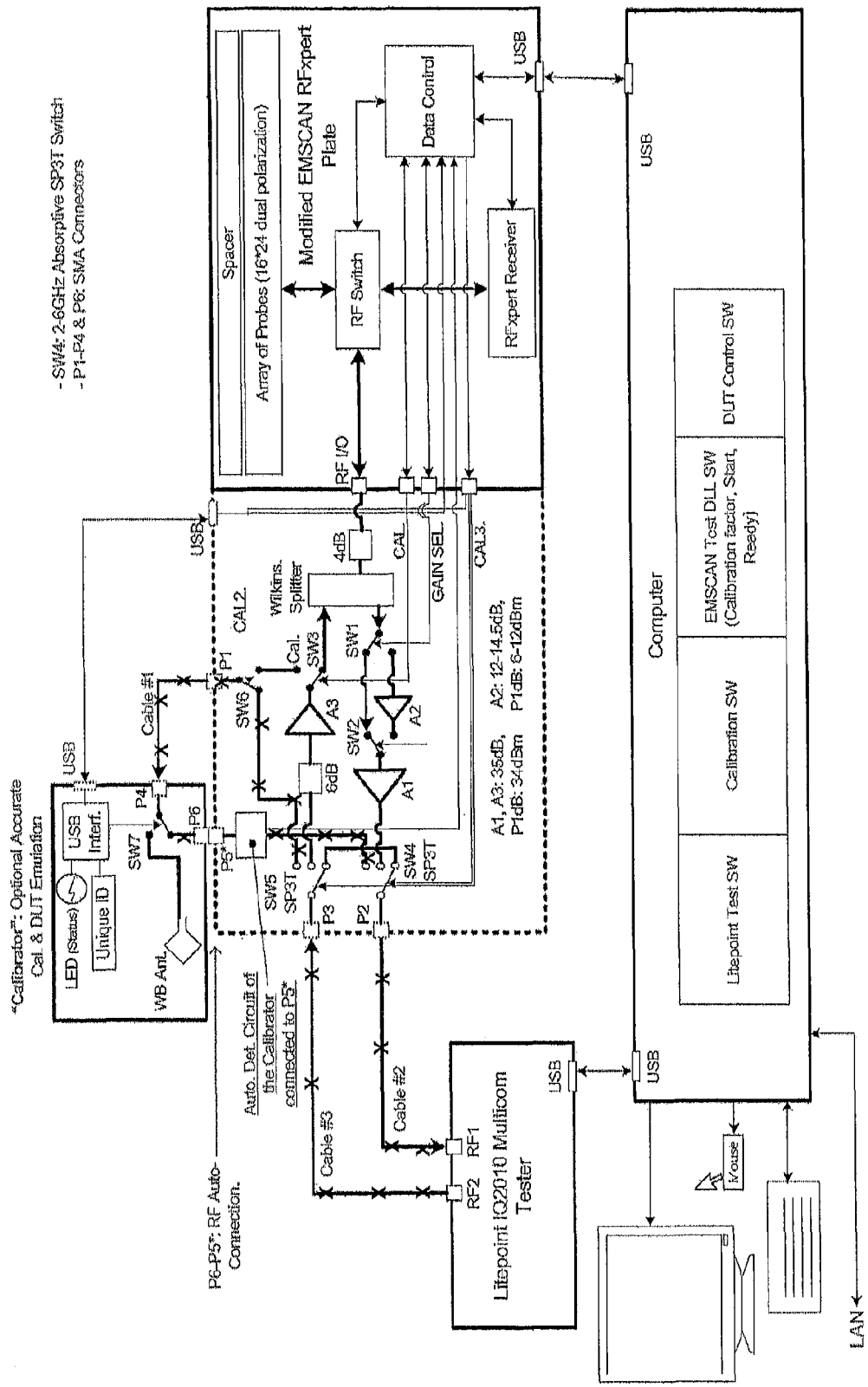

If the calibrator (16) is so connected, the insertion loss for cable #1 is determined (step 1108). The computer (15) switches the connections to create a signal path through cable #1 and bypassing amplifier A3 as highlighted by "x"s in FIG. 13H. The VSG generates a signal through the signal path according to the calibration signal script. The signals are received at the VSA, measured and temporarily stored. FIG. 13I exemplifies the computation of the insertion loss value for cable #1, $IL_{Cable\#1}(f)$, in accordance with the below equation (step 1110):

$$IL_{Cable\#1}(f)=L_{VSG}(f)-L_{VSA}(f)-IL_{P3-P1}(f)-IL_{P5^*-P2}(f)-IL_{P4-P6}(f)-IL_{23m}(f) \quad \text{(eq. 6)}$$

where:

$L_{VSG}(f)$: level of programmed calibrated signal transmitted by the VSG in (dB);

$L_{VSA}(f)$: level of signal received by the VSA in (dB);

$IL_{P3-P1}(f)$: previously measured factory calibration of the insertion loss of input/output module (12), from port P3 to P1 in (dB);

$IL_{P5^*-P2}(f)$: previously measured factory calibration of the insertion loss of input/output module (12), port P5* to P2 in (dB);

$IL_{P4-P6}(f)$: previously measured factory calibration of the insertion loss of the calibrator (16), port P4 to P6 (dB);

$IL_{23m}(f)$: combined insertion loss of cable #3 and #2 in (dB); see (eq. 1).

Figure 13J:
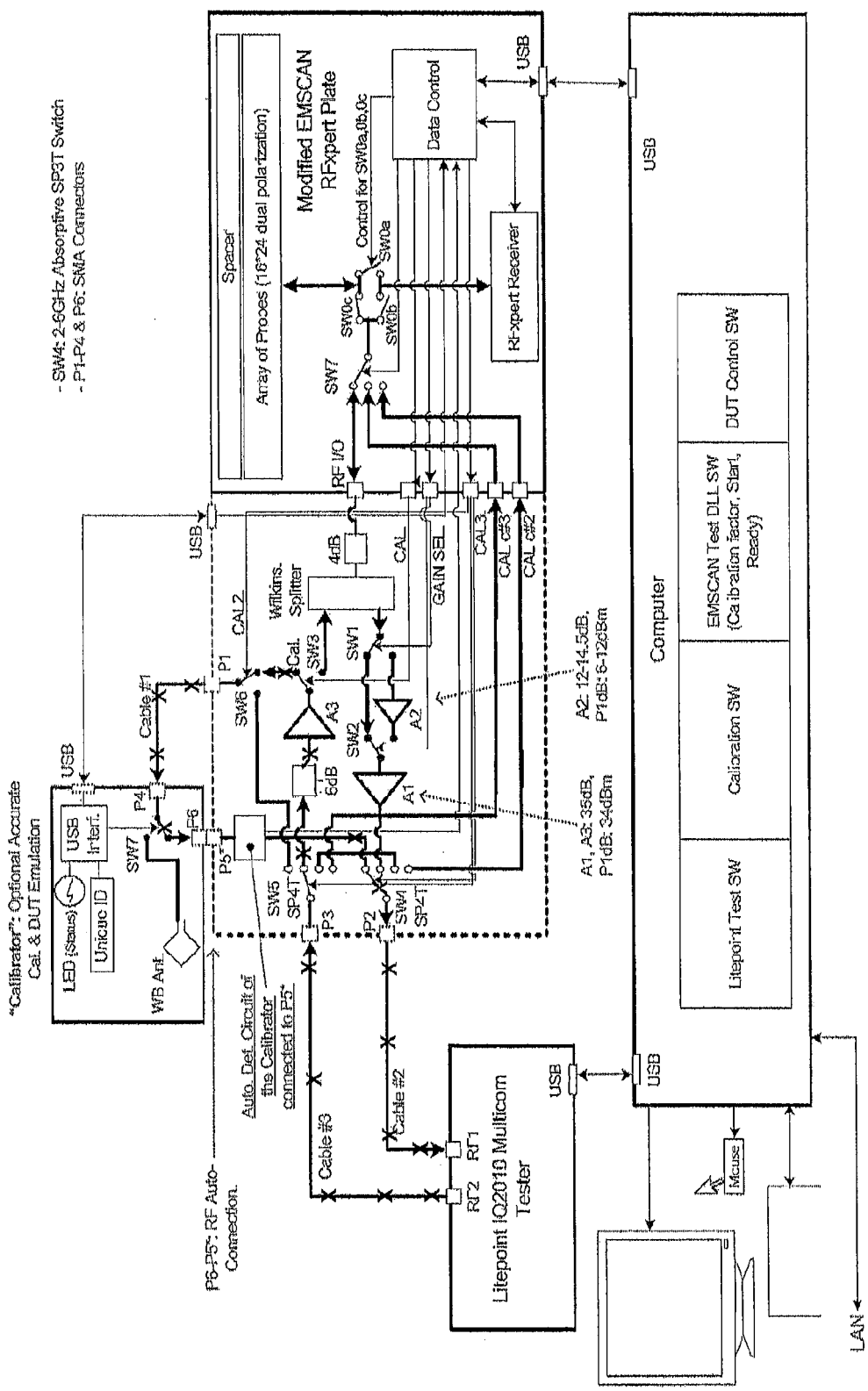

Finally, the conducted loss through the signal path from port P3 through amplifier A3 to port P1 is determined (step 1109). The computer (15) switches the connections to create a signal path through cable #1 including amplifier A3, as highlighted by "x"s in FIG. 13J. The VSG generates a signal through the signal path according to the calibration signal scrip. The signals are received by the VSA, measured and temporarily stored. FIG. 13K exemplifies the computation of the conducted loss, $IL_{P3-P1wPA}(f)$, through the signal path from port P3 through amplifier A1 to port P1, in accordance with the below equation (step 1110):

$$IL_{P3-P1wPA}(f)=L_{VSG}(f)-L_{VSA}(f)-IL_{P5^*-P2}(f)-IL_{P4-P6}(f)-IL_{23m}(f)-IL_{Cable\#1}(f) \quad \text{(eq. 7)}$$

where:

$L_{VSG}(f)$: level of programmed calibrated signal transmitted by the VSG in (dB);

$L_{VSA}(f)$: level of signal received by the VSA in (dB);

$IL_{P5^*-P2}(f)$: previously measured factory calibration of the insertion loss of input/output module (12), port P5* to P2 in (dB);

$IL_{P4-P6}(f)$: previously measured factory calibration of the insertion loss of the calibrator (16), port P4 to P6 (dB);

$IL_{23m}(f)$: combined insertion loss of cable #3 and #2 in (dB); see (eq. 1);

$IL_{Cable\#1}(f)$: insertion loss of cable #1 in (dB); see (eq. 6). In the example shown in FIG. 13K, the negative value of the insertion loss indicates that there is actually an insertion gain, rather than an insertion loss, of about 28 dB.

It will be appreciated that cable calibration process as described above can be used to calibrate any cable regardless of length, type or attenuation. The cable calibration process is automatic, fast, and easy, because it is completely software driven and does not require manual handling of the cable. Moreover, it will be appreciated that the cables calibration process need not be performed repeatedly. This is because the calibrator (16) and the cables are considered to be part of the station (5) and need not be disconnected from the input/output module (12) at all, or at least less frequently than is the case for conventional test stations.

Figure 11B:
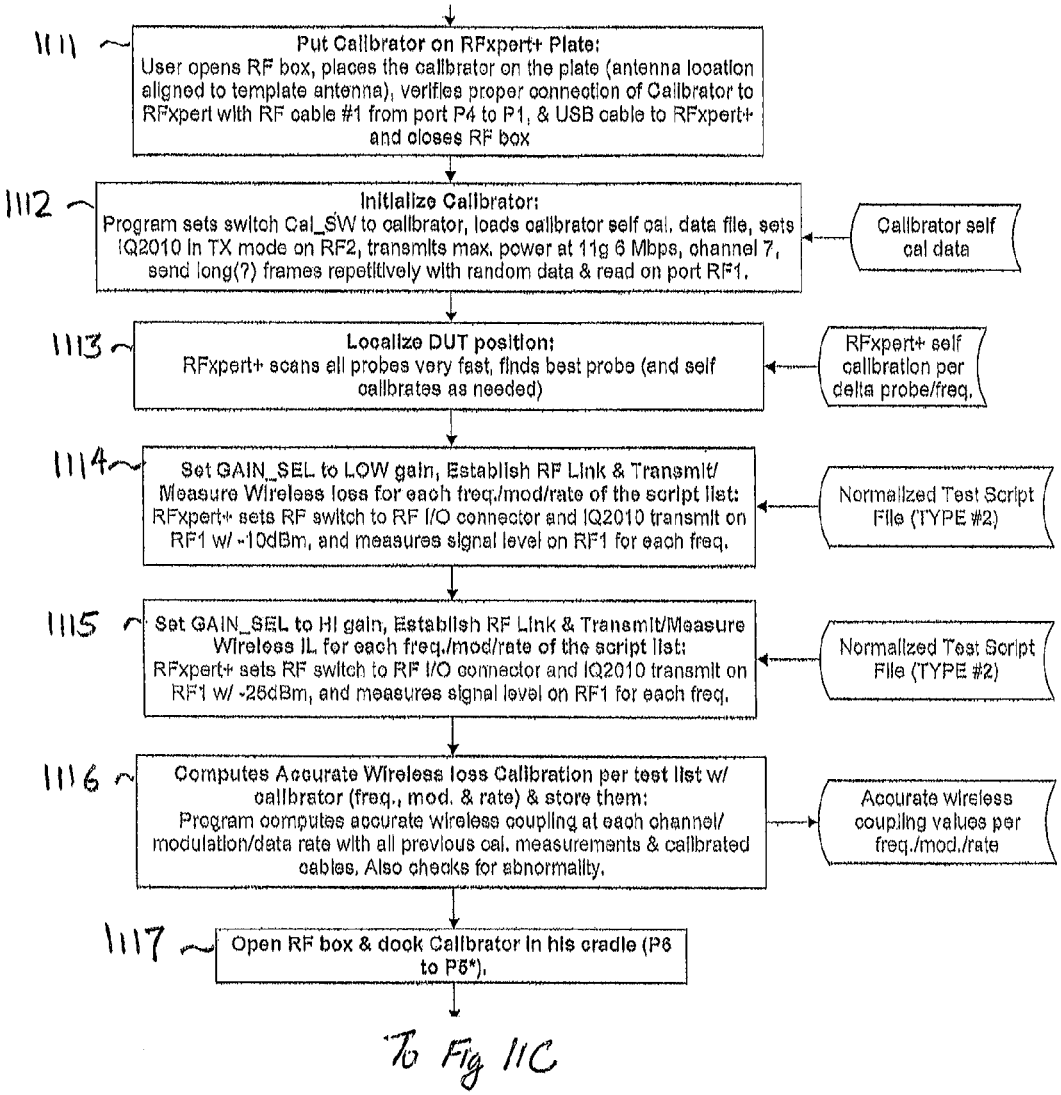
Figure 11C:
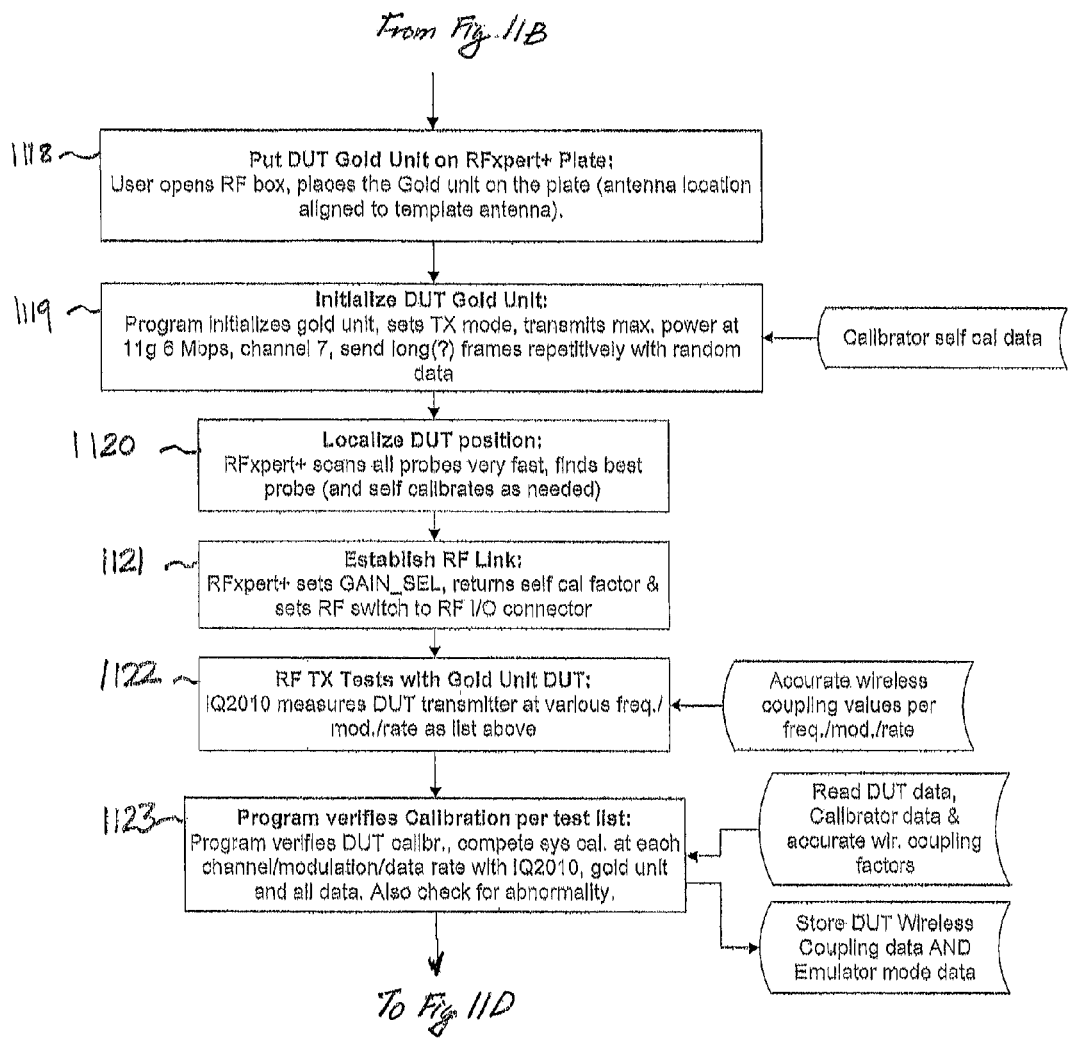

Stage D: Calibration of the Station (5) for Combined Conducted and Wireless Signal Losses for the DUT in Transmit and Receive Modes. The station (5) is calibrated for conducted signal losses when a DUT is in transmit mode and when a DUT is in receive mode (FIG. 11B: steps 1111-1117). In general, this is achieved by sequentially creating appropriate partially conducted and partially wireless signal paths from the VSG through the VSA, using the VSG to generate signals of known power levels according to the calibration signal scripts through those paths, using the VSA to measure the power level of the signal at the end of the signal path, and computing the difference in power level of the signal at the VSG and at the VSA after accounting for other known power losses. As described below, the calibrator (16) is used as a proxy for the DUT in transmit mode and receive mode.

Figure 14A:
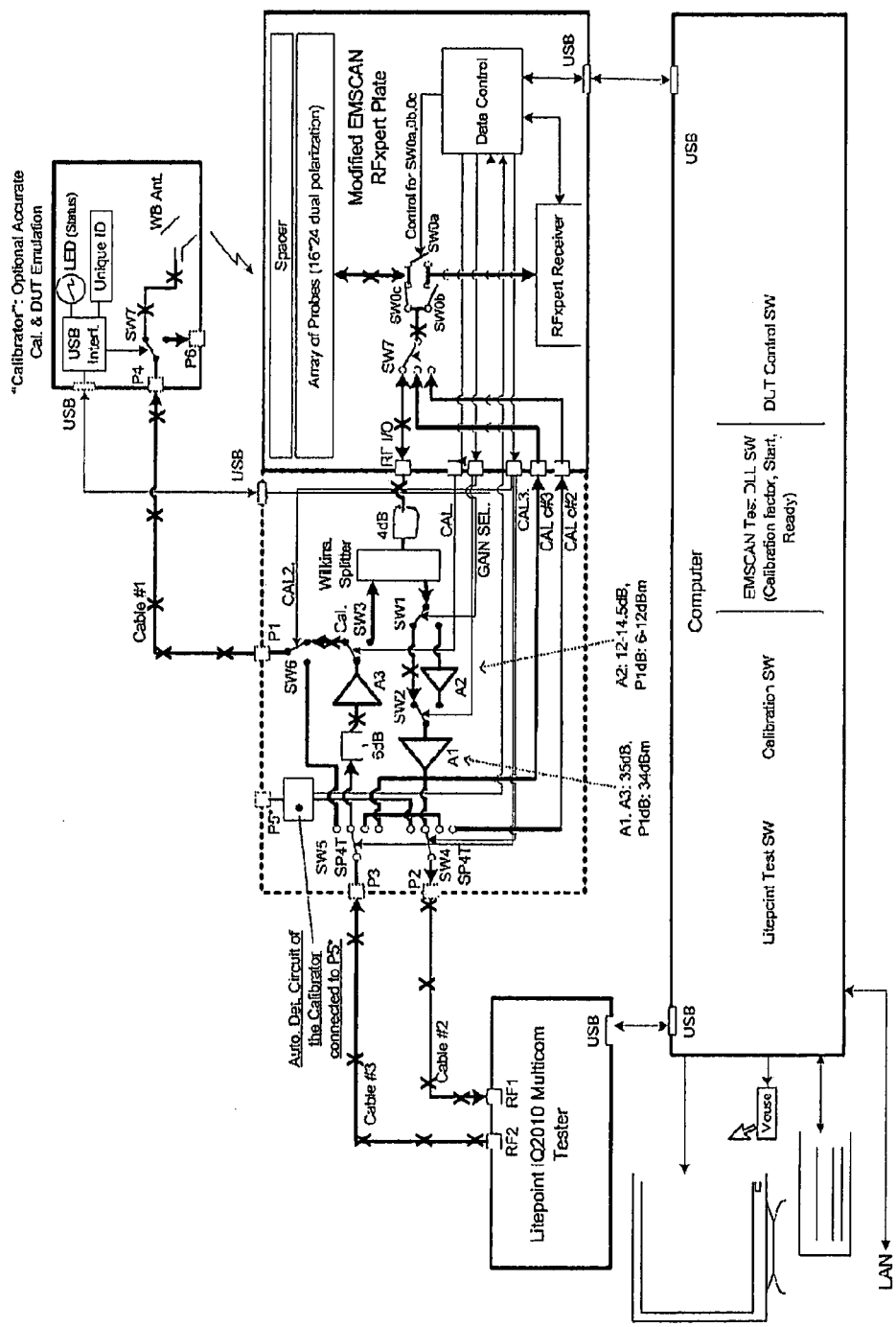

In preparation for these calibrations, the connection between the calibrator (16) and the input/output module (14) at P5*-P6 is severed, and the calibrator (16) is placed on the scanner (10) surface as shown in FIG. 14A (step 1111). The computer (15) switches the connections to create a signal path as highlighted by "x"s in FIG. 14A. The computer (15) loads a self-calibration data file, sets the VSG to transmit mode, and causes the VSG generate random wireless data signals at maximum power on a suitable channel and data rate, which are wirelessly transmitted by the calibrator (16) to the array of antenna probes (101) of the scanner (10), which then conducts the signals to the VSA (step 1112). The scanner (10) localizes the position of the calibrator (16) by querying each of the antenna probes (101) in the antenna array and choosing a single probe which is receiving a strong signal from the calibrator (step 1113). The scanner (10) may self-calibrate as needed during this process.

The conducted and wireless signal loss between a DUT in transmit mode and the VSA is determined. The computer (15) switches the connections to a low-gain signal path including amplifier A1 (but bypassing amplifier A2) as shown in FIG. 14A. The VSG generates signals through the signal path according to the calibration signal script. The signals are wirelessly transmitted by the calibrator (16) to the array of antenna probes (101) of the scanner (10), which then conducts the signals to the VSA (step 1114). FIG. 14B exemplifies the computations of the combined conducted and wireless losses, $IL_{TotwTX}(f)$, through the segment of the highlighted signal path from the calibrator antenna (160) through amplifier A1 to port RF1 in accordance with the following equation (step 1116):

$$IL_{TotwTX}(f)=L_{CalibratorTX\_EIRP}(f)+IL_{DUT\_Ant\_Dist}(d,f)-L_{VSA}(f) \quad \text{(eq. 9)}$$

where:
$L_{CalibratorTX\_EIRP}(f)$: accurately calibrated level of signal radiated by the calibrator (16) in (dB);
where:

$$L_{CalibratorTX\_EIRP}(f)=L_{VSG}(f)-IL_{Cable\#3}(f)-IL_{P3-P1wPA}(f)-IL_{Cable\#1}(f)-IL_{CalibratorP4\_EIRP}(f) \text{ in (dB)};$$

$L_{VSG}(f)$: previously calculated signal transmitted the VSG in (dB);
$IL_{Cable\#3}(f)$: previously measured insertion loss of cable #3 at the test script frequencies in (dB); see (eq. 4) and (eq. 5);
$IL_{P3-P1wPA}(f)$: previously calculated insertion loss of the input/output module (12) P3 to P1 path with amplification; see (eq. 7);
$IL_{Cable\#1}(f)$: previously calculated insertion loss of cable #1 in (dB); see (eq. 6);
$IL_{CalibratorP4\_EIRP}(f)$: previously factory calibrated calibrator (16) insertion loss including its antenna (160) in (dB);
$IL_{DUT\_Ant\_Dist}(d,f)$: previously calculated loss due to DUT antenna separation with the scanner (10) plate, as a function of the separation, d, and the frequency, f, in (dB);
$L_{VSA}(f)$: level of signal received by the VSA in (dB).

It may be noted from (eq. 9) $IL_{TotwTX}(f)$ can be accurately estimated if the both the power level radiated from the calibrator (16), $L_{CalibratorTX\_EIRP}(f)$, and the power level of the received signal at the VSA, $L_{VSA}(f)$, are accurately known, without having to accurately know about any losses in the receive path between the calibrator (16) and the VSA, as long as those losses are repeatable. This relaxes the requirements for any component in the receive path of the station (5).

Next, the computer (15) switches the connections to create a high-gain signal path as shown in FIG. 14A, but also including amplifier A2 in series with amplifier A1. The VSG generates signals through the signal path according to the calibration signal script. The signals are wirelessly transmitted by the calibrator (16) to the array of antenna probes (101) of the scanner (10), which then conducts the signals to the VSA (step 1115). FIG. 14C exemplifies the computations of the conducted losses, $IL_{TotwTX}(f)$, through the segment from of the signal path from the scanner antenna (160) through amplifiers A1 and A2 to port RF2 in accordance with equation 9, above (step 1116).

Next (not shown in FIG. 11B), the conducted and wireless signal loss between the VSG to a DUT in receive mode is determined. The computer (15) switches the connections to create a signal path as highlighted by "x"s in FIG. 14D. The VSG generates a signal through the signal path according the calibration signal script. The signals are wirelessly transmitted by the array of antenna probes (101) to the calibrator (16), which then conducts the signals to the VSA. FIG. 14E exemplifies the computations of the combined conducted and wireless losses, $IL_{TotwRX}(f)$, through the segment from of the highlighted signal path from port RF2 to the calibrator antenna (160) in accordance with the below equations (step 1116):

$$IL_{TotwRX}(f)=L_{VSG}(f)+IL_{DUT\_Ant\_Dist}(d,f)-L_{CalibratorRX\_EIRP}(f) \quad \text{(eq. 10)}$$

where:
$L_{VSG}(f)$: previously calibrated signal transmitted the VSG in (dB);
$IL_{DUT\_Ant\_Dist}(d,f)$: previously calculated loss due to DUT antenna separation with the scanner (10) plate, as a function of the separation, d, and the frequency, f, in (dB);
$L_{CalibratorRX\_EIRP}(f)$: accurately calculated level of signal detected by the calibrator (16), in (dB);
where:

$$L_{CalibratorRX\_EIRP}(f)=L_{VSA}(f)+IL_{Cable\#2}(f)+IL_{P1-P2TX}(f)+IL_{Cable\#1}(f)+IL_{CalibratorP4\_EIRP}(f) \text{ in (dB)};$$

$L_{VSA}(f)$: level of signal received by the VSA in (dB).
$IL_{Cable\#2}(f)$: insertion loss of cable #2 in (dB), see (eq. 4) and (eq. 5);
$IL_{P1-P2TX}(f)$: previously factory calibrated insertion loss in the input/output module (12) from port P1 to P2 in (dB);
$IL_{Cable\#1}(f)$: insertion loss of cable #1 in (dB), see (eq. 6);
$IL_{CalibratorP4\_EIRP}(f)$: previously factory calibrated calibrator (16) insertion loss including its antenna (160) in (dB).

At the conclusion of Stage D, the calibrator (16) is removed from the scanner (16) and re-connected to the input/output module (14) at port P5*-P6 (step 1117). The station (5) is completely calibrated and ready for either additional calibration in accordance with stages E, F, and G, or may be used for DUT testing in accordance with stage H.

Figure 7:
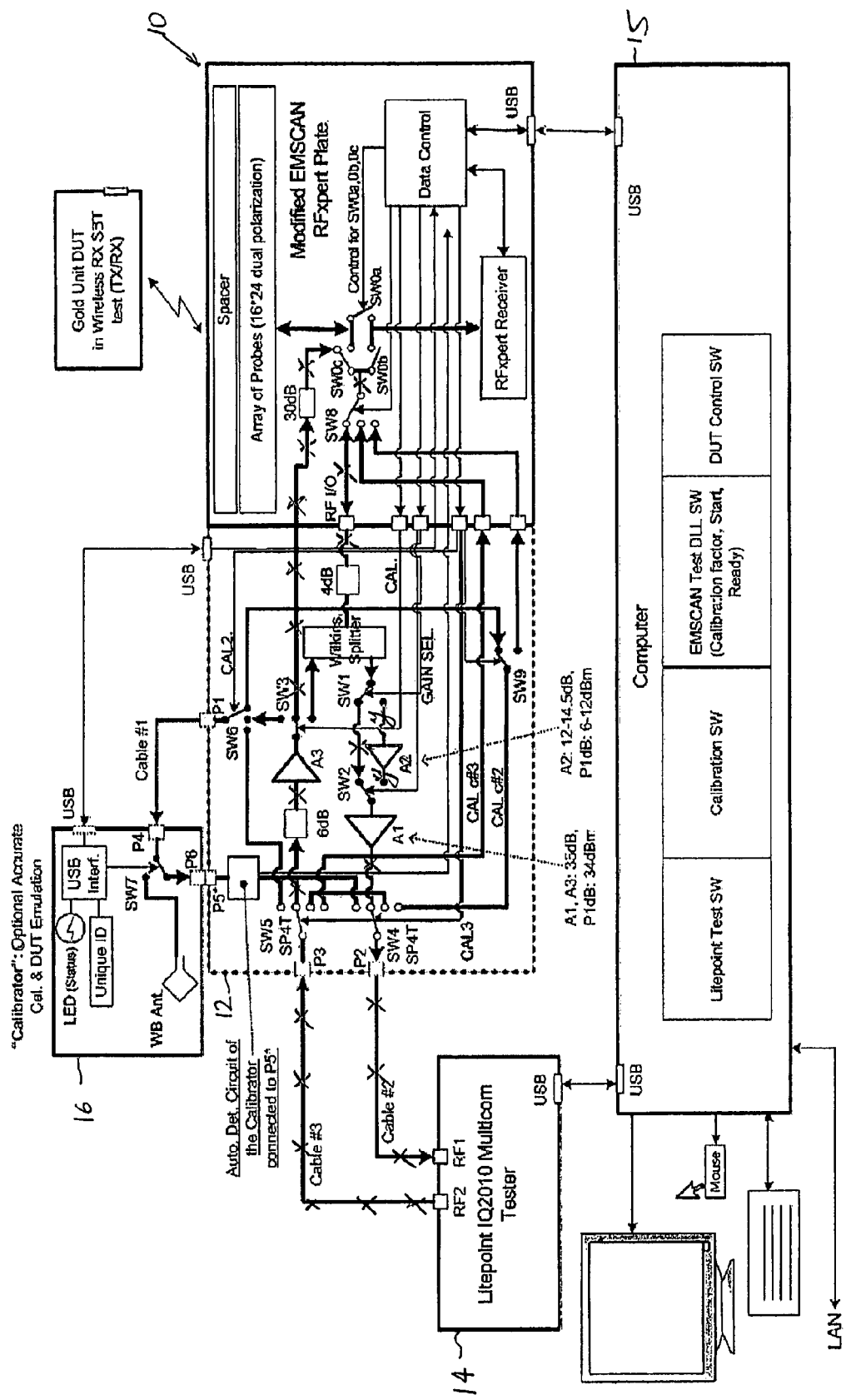
FIG. 7 shows a schematic circuit diagram of one embodiment of the test station of the present invention, when used to calibrate the test station for temperature effects.

Stage E: (Optional) Calibration of the Station (5) for Temperature Effects. As will be appreciated by those skilled in the art, certain components in the station (5), such as power amplifiers A1, A2, A3 as shown in FIG. 7, may provide slightly varied performance as the temperature changes. The accuracy of the station (5) can be further improved by calibrating the station (5) for temperature effects using a temperature calibration process.

The temperature calibration process may be performed at any time. In one embodiment, the temperature calibration process may be performed in between successive tests of the DUT when a DUT that has just been tested is removed from the scanner (10), and another DUT is being placed on the scanner (10). In this manner, the temperature calibration process does not add to the total time in the DUT testing process.

The temperature calibration process may be performed at one signal frequency or several different signal frequencies. In one embodiment, the temperature recalibration process is performed at one signal frequency and uniformly applied to signals of all other frequencies, on the assumption that the effects of temperature changes do not vary with signal frequency. In another embodiment, the temperature recalibration process is performed for at least two different signal frequencies (e.g., 2.45 GHz, 5 GHz, 5.4 GHz and 5.8 GHz) to establish a temperature recalibration line or curve, which establishes a trend line to interpolate the effect of temperature for signal frequencies intermediate to those frequencies. In another embodiment, the temperature recalibration may take place at multiple frequencies, for example at each frequency of the signals coded by the calibration signal script.

Figure 6:
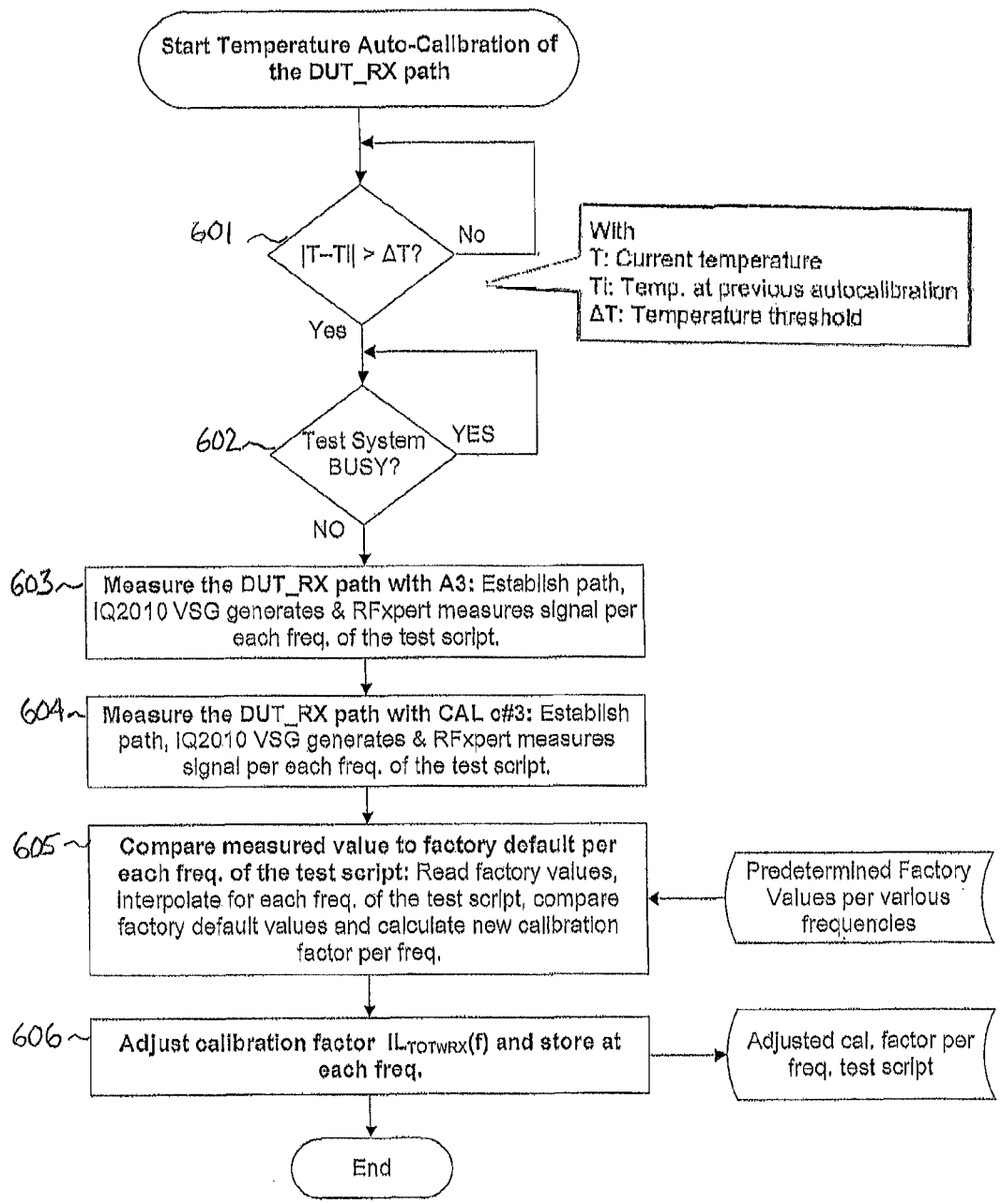
FIG. 6 shows a flowchart of one embodiment of a method for calibrating the test station as shown in FIG. 5 for temperature effects.

The temperature calibration process to calibrate for temperature effects on amplifier A3, as shown in FIG. 5, is described schematically in FIG. 6. Temperature sensors monitor the current temperature, T, which the computer (15) compares to a temperature, Ti, at which a previous temperature calibration was performed, which may be a factory calibration temperature (step 601). If the difference between T and Ti exceeds a threshold value, ΔT, the computer (15) checks if it is busy with another process (step 602). If the station (5) is not busy, the computer (15) establishes a signal path through amplifier A3, as highlighted with "x"s in FIG. 5. The VSG generates a signal through the signal path in accordance with the calibration signal script. The signal is routed through the scanner (10) and received by the computer (15) for measurement (step 603). Next, the test module (14) establishes a signal path CAL c#3, excluding amplifier A3, as marked with "y"s in FIG. 5. The VSG generates a signal through the signal path in accordance with the calibration signal script. The signal is routed through the scanner (10) and received by the computer (15) for measurement (step 604). These measured signals levels are compared to a pre-determined or pre-calibrated signal value at a given temperature for the same frequencies (step 605). The computer (15) calculates a temperature calibration factor for the amplifier A3 as the difference between the power level measured for the signals conducted through the path including amplifier A3, and the power level measured for the signals conducted through the path excluding amplifier A3. This temperature calibration factor can be used to adjust total wireless and conducted insertion losses, $IL_{TotwRX}(f)$, for when a DUT in receive mode is tested (step 606).

Figure 8:
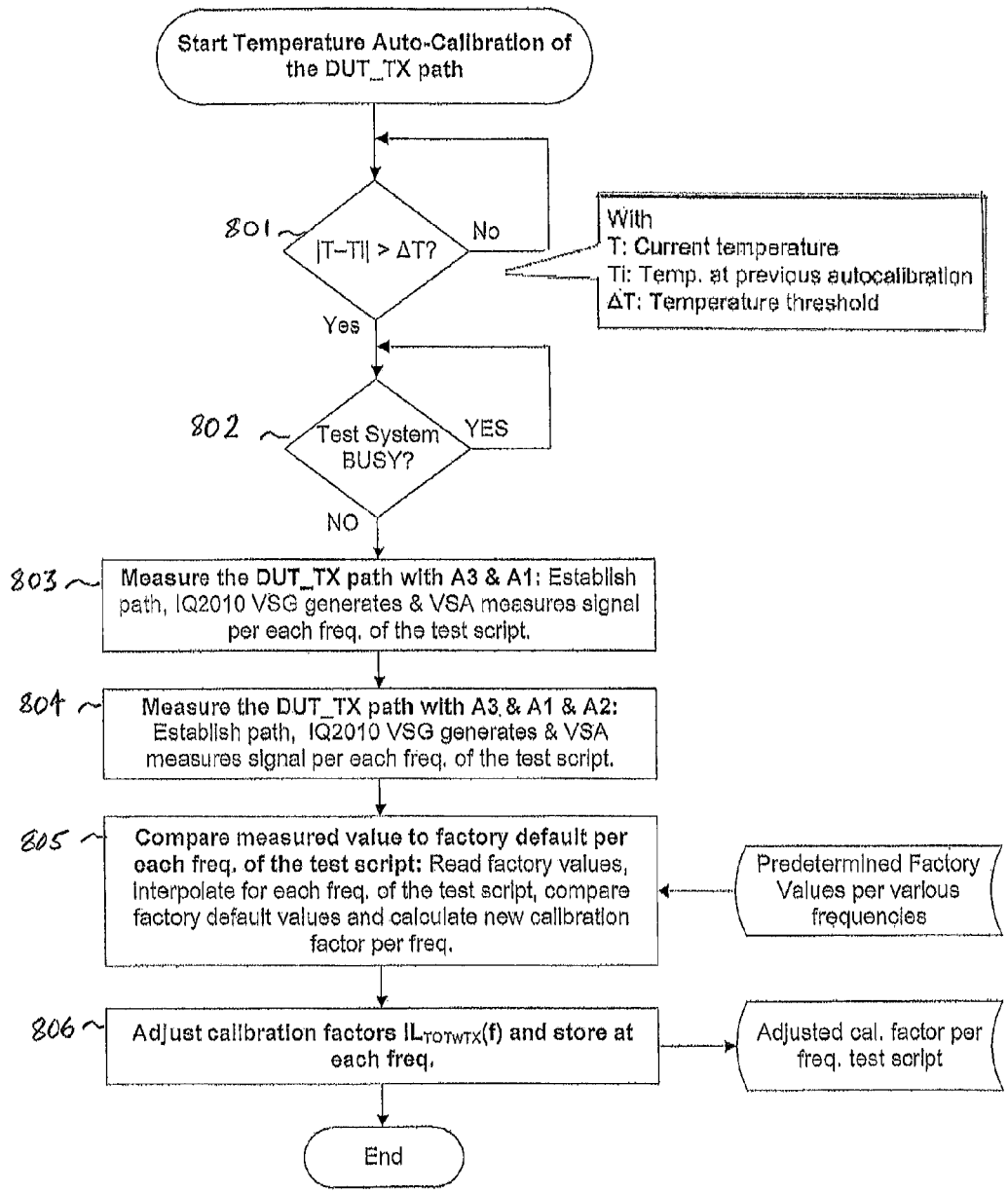
FIG. 8 shows a flowchart of one embodiment of a method for calibrating the test station as shown in FIG. 7 for temperature effects.

The temperature calibration process to calibrate for temperature effects on amplifiers A1 and A2, as shown in FIG. 7, is described schematically in FIG. 8. Steps (801) and (802) are the same as steps (601) and (602) as described above. The computer (15) establishes a signal path through amplifiers A3 and A1, as marked with "x"s in FIG. 7. The VSG generates a signal through the signal path in accordance with the calibration test script. The signal is received by the VSA, measured and temporarily stored (step 803). Next, the computer (15) establishes a signal path through amplifiers A3, A2 and A1, as marked with "x"s and "y"s in FIG. 7. The VSG generates a signal through the signal path in accordance with the calibration test script. The signal is received by the VSA, measured and temporarily stored (step 804). These measured signal levels are compared to a pre-determined or pre-calibrated signal value at a given temperature for the same frequencies (step 805). The computer (15) calculates a temperature calibration factor for amplifier A3 and A1 (collectively), and A3 and A1 and A2 (collectively) as the difference between the power levels measured for the signals conducted through the paths including a particular amplifier and the power level measured for the signals conducted through the path excluding that particular amplifier. These temperature calibration factors can be used to adjust total wireless and conducted insertion losses, $IL_{TotwTX}(f)$, for when a DUT in transmit mode is tested (step 806).

Stage F: (Optional) Calibration of the Station (5) with a GU. The station (5) is calibrated using a GU (FIG. 11C: steps (1118) to (1123)).

Figure 15A:
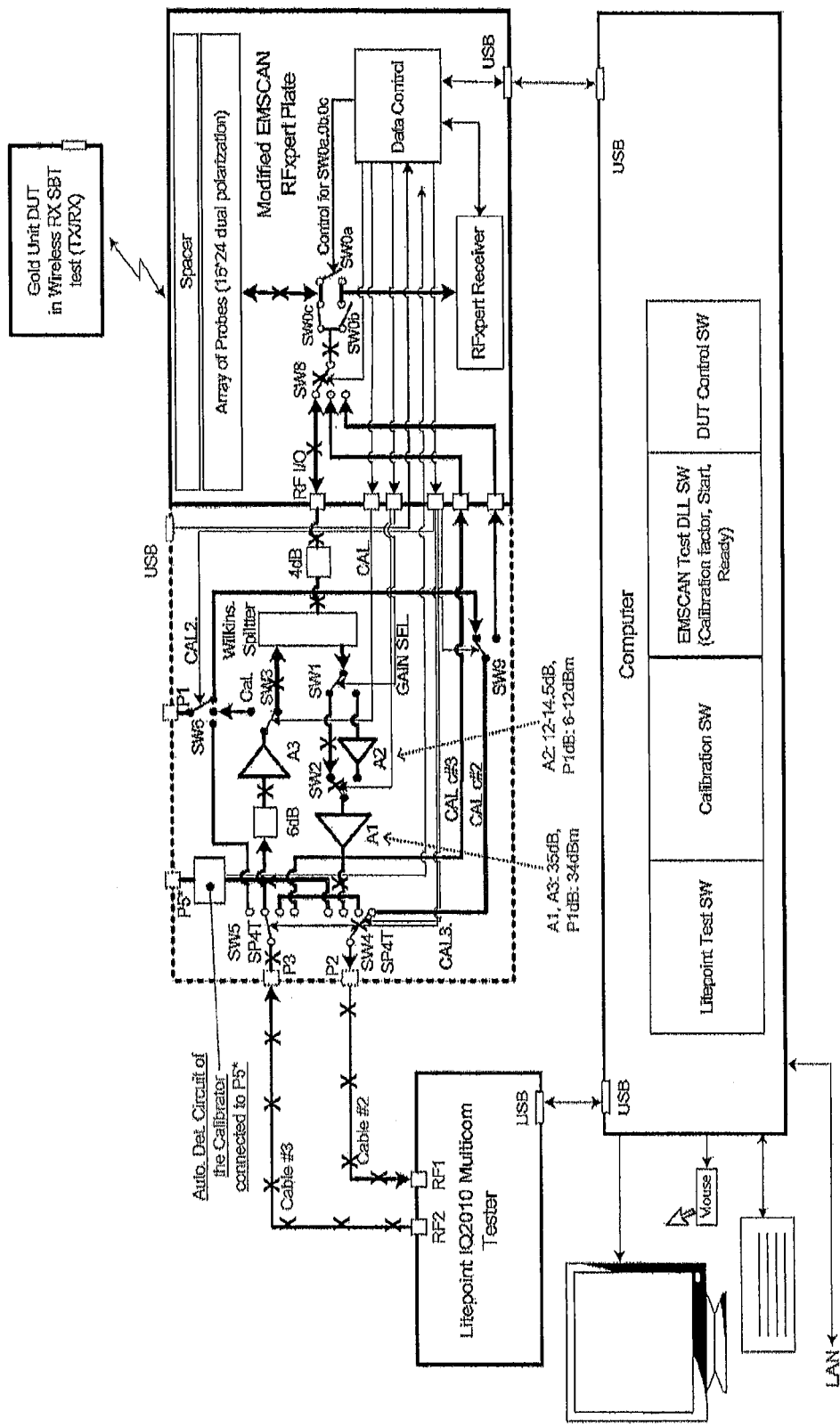
FIGS. 15A to 15C show schematic circuit diagrams of one embodiment of the test station when being calibrated using GUs.

The GU is placed on the scanner (10) surface with the GU antenna aligned with the antenna position marker on the scanner (10) surface as shown in FIG. 15A (step 1118). The computer (15) initializes the GU, sets the GU to the transmit mode, and causes the GU to transmit random data at maximum power on a suitable channel and data rate (step 1119). The scanner (10) localizes the position of the GU by querying each of the antenna probes (101) in the antenna array and choosing a single probe which is receiving a strong signal from the GU (step 1120). The software establishes an wireless link between the system (10) and the GU, sets the gain, and sets the RF switch to the RF I/O connector (step 1121).

Figure 15B:
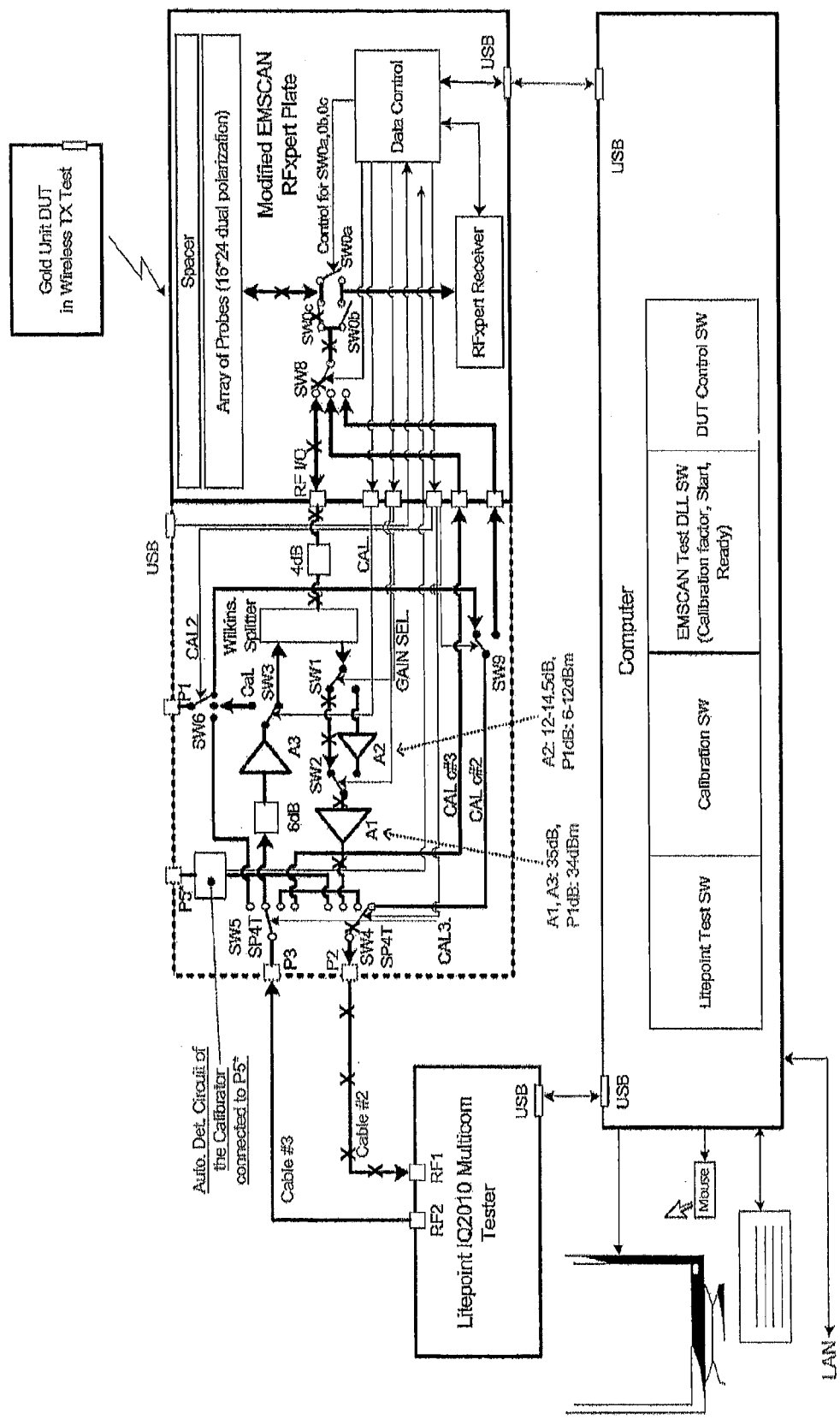

Next, the system (5) is calibrated using a GU in transmit mode. The computer (15) switches the connections to establish a signal path as highlighted with "x"s in FIG. 15B. The GU is permitted to transmit signals at various frequencies modulations and data rates. The signals are detected by the scanner (10) and conducted to the VSA (step 1122). The calibration of the station (5) is verified by ascertaining if the difference between the level of the signal presumed to be generated by the GU, $L_{GUTX}(f)$, and the level of the signal measured by the VSA, $L_{VSA}(f)$, can be accounted for by the previously calibrated conducted and wireless losses between the calibrator antenna (160) and the VSA, $IL_{TotwTX}(f)$ (step 1123):

$$L_{GUTX}(f) - L_{VSA}(f) = IL_{TotwTX}(f)? \qquad (eq. 10)$$

Figure 15C:
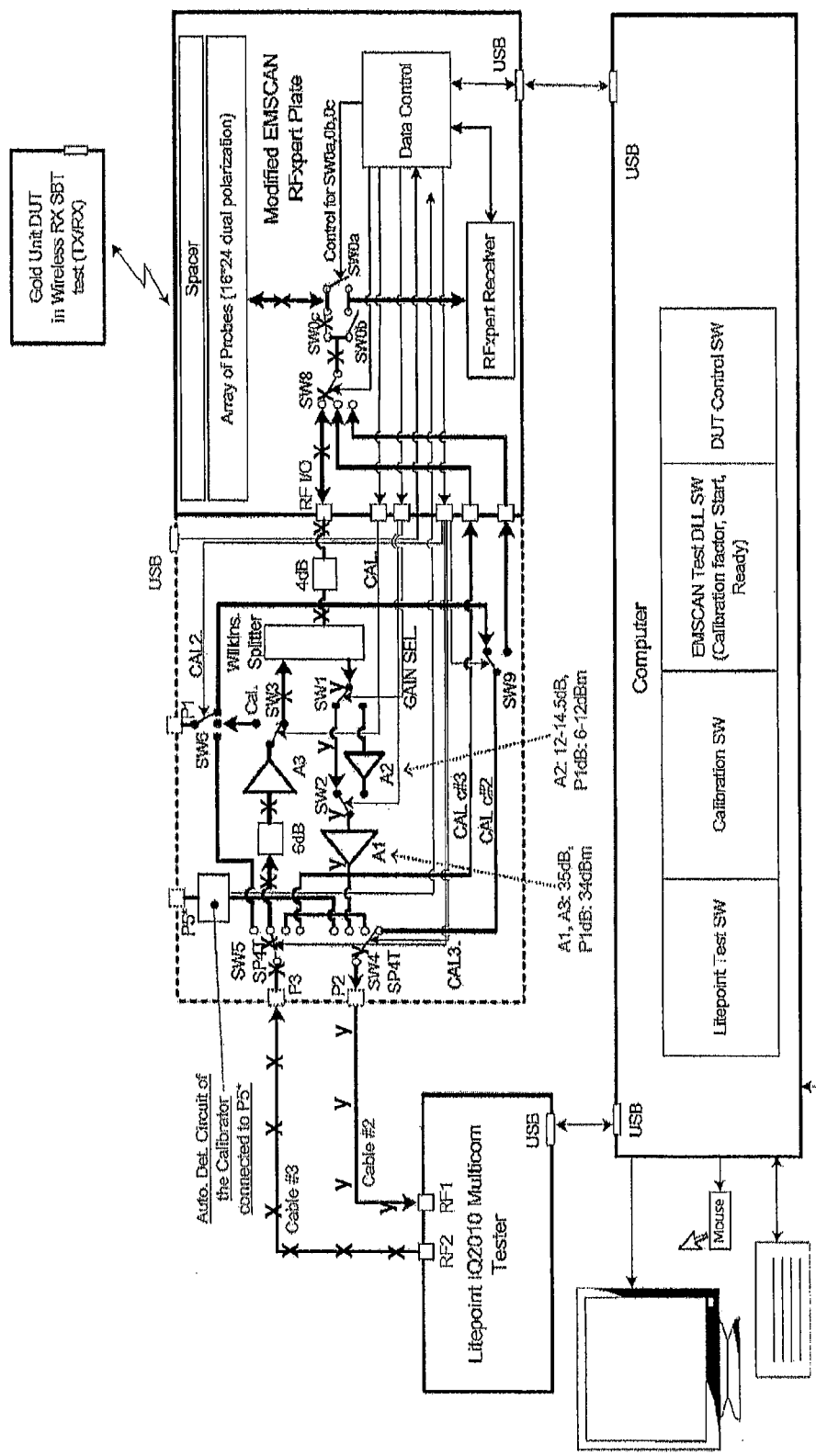

Next (not shown in FIG. 11C), the system (5) is calibrated using a GU in receive mode. The computer (15) switches the connections to establish a signal path as highlighted with "x"s and with "y"s in FIG. 15C. The VSG generates signals along the signal path as highlighted by "x"s. The signals are radiated by the antenna probes (101) and received by the GU. The calibration of the station (5) is verified by ascertaining if the difference between the level of the signal generated by the VSG, $L_{VSG}(f)$, and the level of the signal reportedly received by the GU, $L_{GURX}(f)$, can be accounted for by the previously calibrated conducted and wireless losses between the VSG and the calibrator antenna, $IL_{TotwRX}(f)$::

$$L_{VSG}(f) - L_{GURX}(f) = IL_{TotwRW}(f)? \qquad (eq. 11)$$

Stage G: (Optional) Calibration of the Station (5) Using the Calibrator (16) as a GU Emulator.

Figure 11D:
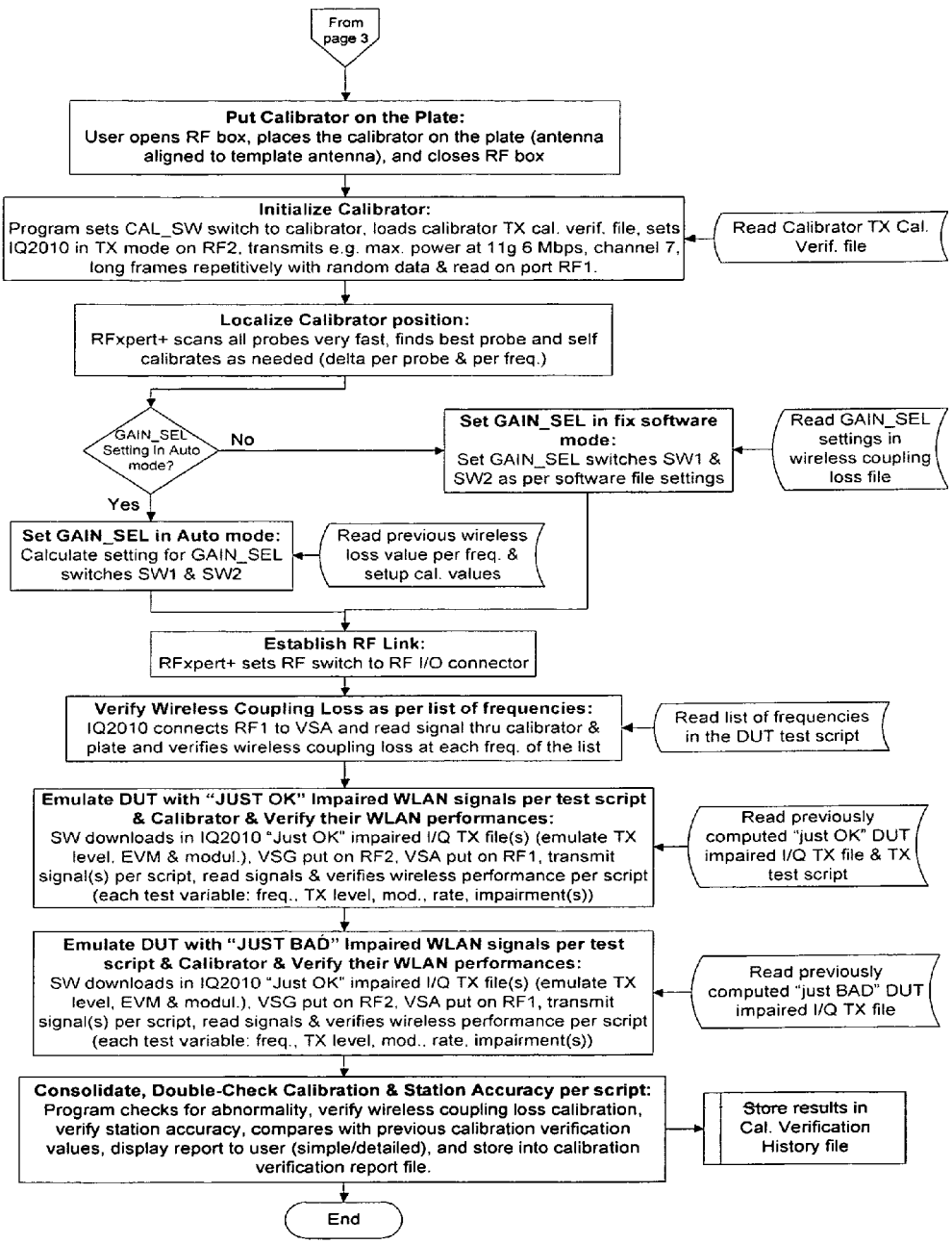

The station (5) is calibrated using the calibrator (16) to emulate GUs of various standards in transmit mode (FIG. 11D: steps (1124) to (1134)). It will be appreciated by persons skilled in the art that when the DUT manufacturing process is stable, testing of transmit functions of the DUT is primarily directed to verifying that the components of the DUT are properly soldered. However, when the manufacturing process is not stable (e.g. during pilot run or early production stage), the DUT may be affected by other problems relating to unstable software (DUT or test program or drivers), placement and orientation of components within the DUT, missing or defective components, quality issues or design problems with the DUTs printed circuit board, and timing problems. The aforementioned problems may result in one or more of the following signal parameters being out of specification: (a) transmit level per frequency; (b) modulation and data rate, (c) associated signal integrity as measured by error vector magnitude (EVM) parameter; (d) spectral mask and flatness; (e) occupied bandwidth (OBW); (f) phase noise and IQ-imbalance; (g) clock frequency offset; and (h) center frequency leakage. Different standards of GUs may be emulated by preparing calibration signal script coding for transmit signals having one or more target signal parameters out of specification to varying degrees. By way of non-limiting example, Table 1 summarizes the signal parameters of transmit signals, $TX_{out_{GU1}}$ and $TX_{out_{GU2}}$, for the design specification of a DUT and targets for "good", "marginally good" and "bad" GUs in transmit mode. The calibrator (16) is made to accurately emulate the DUT and various standards of GUs by preparing a calibration signal script for the VSG to adjust the output level to match the desired value of 12.5 dBm EIRP resp. 9.5 dBm EIRP, and relaxing the EVM from the intrinsic high linearity of −35 dB to −14 dB resp. −26 dB. The signal file can be further revised to reduce OBW, to degrade any subcarrier, or affect the spectral mask as needed.

TABLE 1

|  | TXout$_1$ | TXout$_2$ |
|---|---|---|
| DUT specification | +12.5 dBm EIRP +/− 1 dBm at channel 1 at 11 g 6 Mbps EVM <= −14 dB OBW >= 16 MHz | +9.5 dBm EIRP +/− 1 dBm at channel 7 at 11 n 121.5 Mbps, EVM <= −26 dB OBW >= 37 MHz, sub-carrier 23 >= −2 dBc |
| Good GU | +12.8 dBm EIRP at channel 1 at 11 g 6 Mbps EVM = −19 dB OBW = 16.3 MHz | +9.1 dBm EIRP at channel 7 at 11 n 121.5 Mbps EVM = −28 dB OBW = 38 MHz sub-carrier 23 = −1.5 dBc |
| Marginally Good GU | +11.6 dBm EIRP at channel 1 at 11 g 6 Mbps EVM = −14 dB OBW = 16.3 MHz | +10.5 dBm EIRP at channel 7 at 11 n 121.5 Mbps EVM = −26 dB OBW = 38 MHz sub-carrier 23 = −1.9 dBc |
| Bad GU | +12.8 dBm EIRP at channel 1 at 11 g 6 Mbps EVM = −11 dB OBW = 16.3 MHz | +8.2 dBm EIRP at channel 7 at 11 n 121.5 Mbps EVM = −25 dB OBW = 38 MHz sub-carrier 23 = −2.1 dBc |

To begin the calibration process, the calibrator (16) is placed on the scanner (10) (step 1124). The computer (16) reads a calibration signal script, sets the test module (14) in the transmission mode, causing the calibrator (16) to transmit random data at maximum power on a suitable channel and data rate (step 1125). The scanner (10) localizes the position of the calibrator (16) by querying each of the antenna probes (101) in the antenna array and choosing a single probe which is receiving a strong signal from the calibrator (step 1126). The system (5) adjusts the gains settings for the scanner input/output module (12) based either on gain settings read from a wireless coupling loss file (step 1128) or by calculating gain settings based on previous wireless values (step 1129).

The computer (15) switches the connections to create a signal path as highlighted by "x"s in FIG. 14A (step 1130). The VSG generates signals through the signal path such that the signal at the calibrator antenna (160) has the parameters prescribed by the calibration signal script for the DUT, and the various levels of GUs (steps 1131, 1132, and 1133). In each case, the calibration of the station (5) is verified by ascertaining if the difference between the level of the signal presumed to be generated by the calibrator antenna (160), $L_C(f)$, and the level of the signal measured by the VSA, $L_{VSA}(f)$, can be accounted for by the previously calibrated conducted and wireless losses between the calibrator antenna (160) and the VSA, $IL_{TotwTX}(f)$ (step 1134):

$$L_C(f) - L_{VSA}(f) = IL_{TotwTX}(f)? \quad \text{(eq. 12)}$$

It will be appreciated that the above relationship calibrates the station (5), and so verifies the performance of the scanner (10), by testing the correlation between target level of the signal at the calibrator antenna (160) with a measured level of the signal at the VSA. The calibration results are stored as calibration verification values, and displayed to the user in the form of a report.

In the depicted embodiments of the test station (5), the calibrator (16) is used to emulate a SISO (i.e., 1 receiver, 1 transmitter) GU. In other embodiments (not shown) the calibrator (16) can be used emulate a MIMO (i.e. at least one receiver and more than one transmitter, or more than one receiver and at least one transmitter) GU device by equipping the station (5) with multiple VSG units with multiple bidirectional amplifiers, multiple calibrator antennas (160), and a scanner (10) with a wireless coupling plate having more than one simultaneous coupling path.

The station (5) is also calibrated using the calibrator (16) to emulate GUs of various standards in receive mode. For a DUT in receive mode, it is conventional to characterize its receive sensitivity at a given channel frequency, data rate and receive power level by counting the number of packets and calculating the bit error rate (BER). For 802.11a/g/n modulation, the receive power minimum sensitivity is defined as the power level where the BER reaches 10% with a frame of 4096 bytes PSDU (Physical layer Service Data Unit). For 802.11b, the receive power minimum sensitivity is defined as the power level where the BER reaches 8% with a frame of 4096 bytes PSDU (Physical layer Service Data Unit). Different standards of GUs may be emulated by preparing calibration signal script coding for receive signals having specified pairs of BER and receive power levels. By way of non-limiting example, Table 2 summarizes the target receive power levels and target BERs for the design specification of a DUT and targets for "good", "marginally good" and "bad" GUs in receive mode.

TABLE 2

|  | $L_{RX\,min\,Sensitivity\,1}$ = −68 dBm at channel 11 at 11 n 52 Mbps (MCS5, OFDM/ 64-QAM, 20 MHz). | $L_{RX\,min\,Sensitivity\,2}$ = −65 dBm at channel 2 at 11 n 52 Mbps (MCS5, OFDM/ 64-QAM, 20 MHz). |
|---|---|---|
| DUT specification | BER shall be <10% | BER shall be <10% |
| Good GU | BER = 4.5% | BER = 2% |
| Marginally Good GU | BER = 9.5% | BER = 9.7% |
| Bad GU | BER = 11% | BER = 11.7% |

It will be appreciated that because the test signal is generated by the VSG under the control of the calibration signal script, one or more of the other signal parameters may be impaired to more realistically simulate real-world conditions in which a DUT may need to perform to achieve a target BER. By way of non-limiting example, the signal generated by the VSG may be slightly impaired from EVM=−35 dB to EVM=−15 dB.

In order for the calibrator (16) to emulate a GU in receive mode, the station (5) must further comprise a bit error detector to measure the BER of the signal received by the calibrator (16). In one embodiment, the bit error detector comprises a receiver (such as, but not limited to, a WLAN receiver) and a BER meter to count the BER. Although possible, this embodiment is not preferred because it is fairly complicated, and because chipset specific and minimum receive sensitivity performance may vary with time and temperature. In an alternative embodiment, the station (5) is provided with bit error detector to measure the BER at the VSA, a variably controllable analyzer amplifier or attenuator to vary the amplitude of the signal received at the VSA, and variably controllable generator amplifier or attenuator to vary the amplitude of the signal generated by the VSG. The bit error detector, the analyzer amplifier or attenuator and the generator amplifier or attenuator may be implemented by hardware, software, or both. In one embodiment, bit error detector and the analyzer amplifier or attenuator are both implemented entirely in software. For example, a variably controllable input attenuator may be used in conjunction with the VSA (such as provided on the LitePoint IQ2010™ tester (LitePoint Corporation, CA, USA)) to vary the input receive level and set it at the target receive power level so as to increase or decrease the BER. The input receive level of the VSA may not be the same as a real device but the BER condition is similar. It is possible to extract the baseband signal from the back of the instrument and compute the BER without major hardware or software addition or change. Alternatively, where the power level is sufficiently above the minimum receive power of the VSA, the signal can be modified so that regardless of power level, there will be a specific BER at the VSA.

Figure 14D:
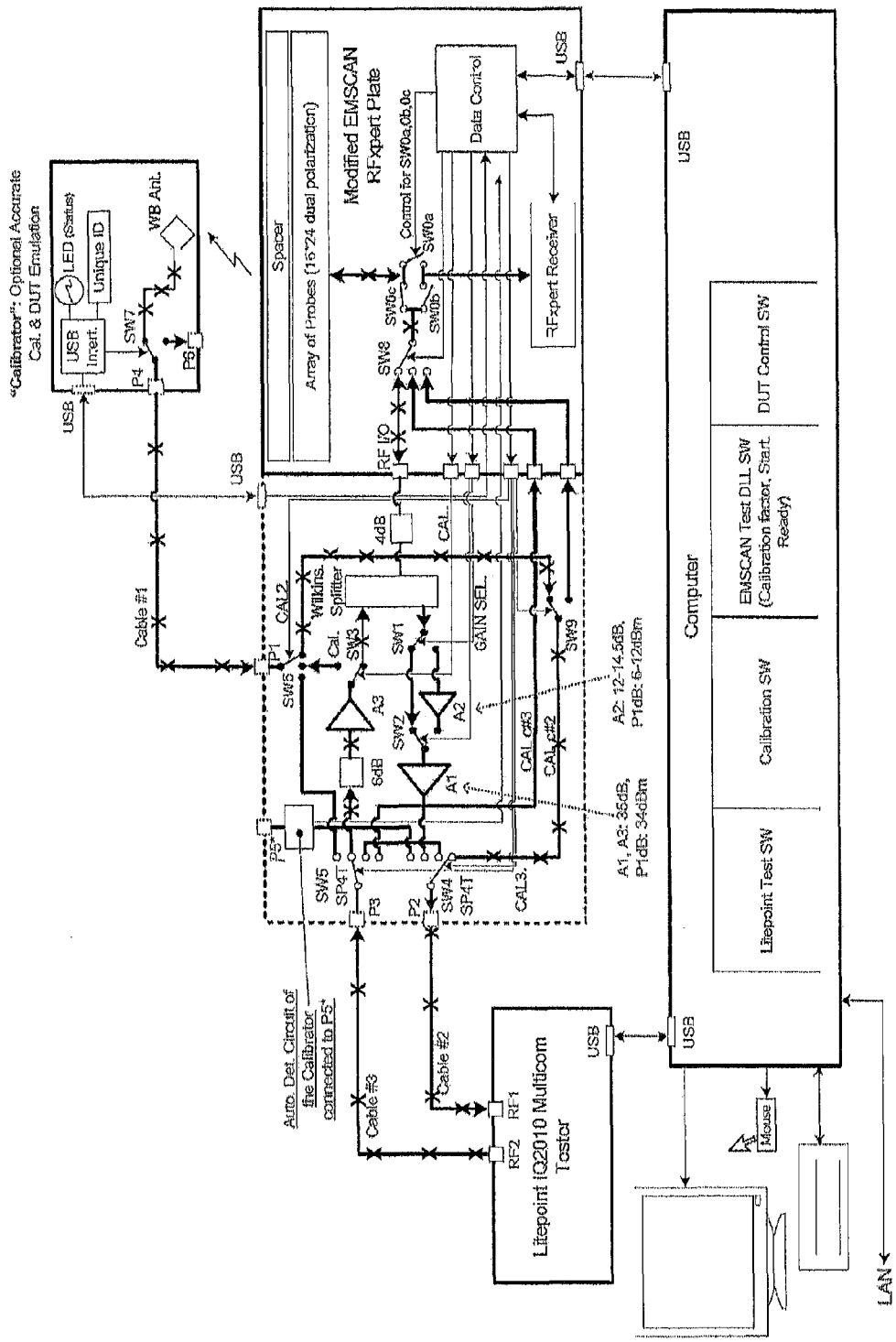

To begin the calibration process, the computer (15) switches the connections to create a signal path as highlighted by "x"s in FIG. 14D. The VSG generates signals through the signal path in accordance with the calibration signal script. The analyzer amplifier or attenuator is used to attenuate (or amplify) the signal at the VSA until its power level matches the target input receive level. The generator amplifier or attenuator is used to attenuate (or amplify) the signal at the VSG until the BER of the signal as measured by the bit error detector matches the target BER. The power level of the signal generated at the VSG needed to create the target BER at the VSA is recorded and correlated to the target input receive level and the target BER.

Figure 2:
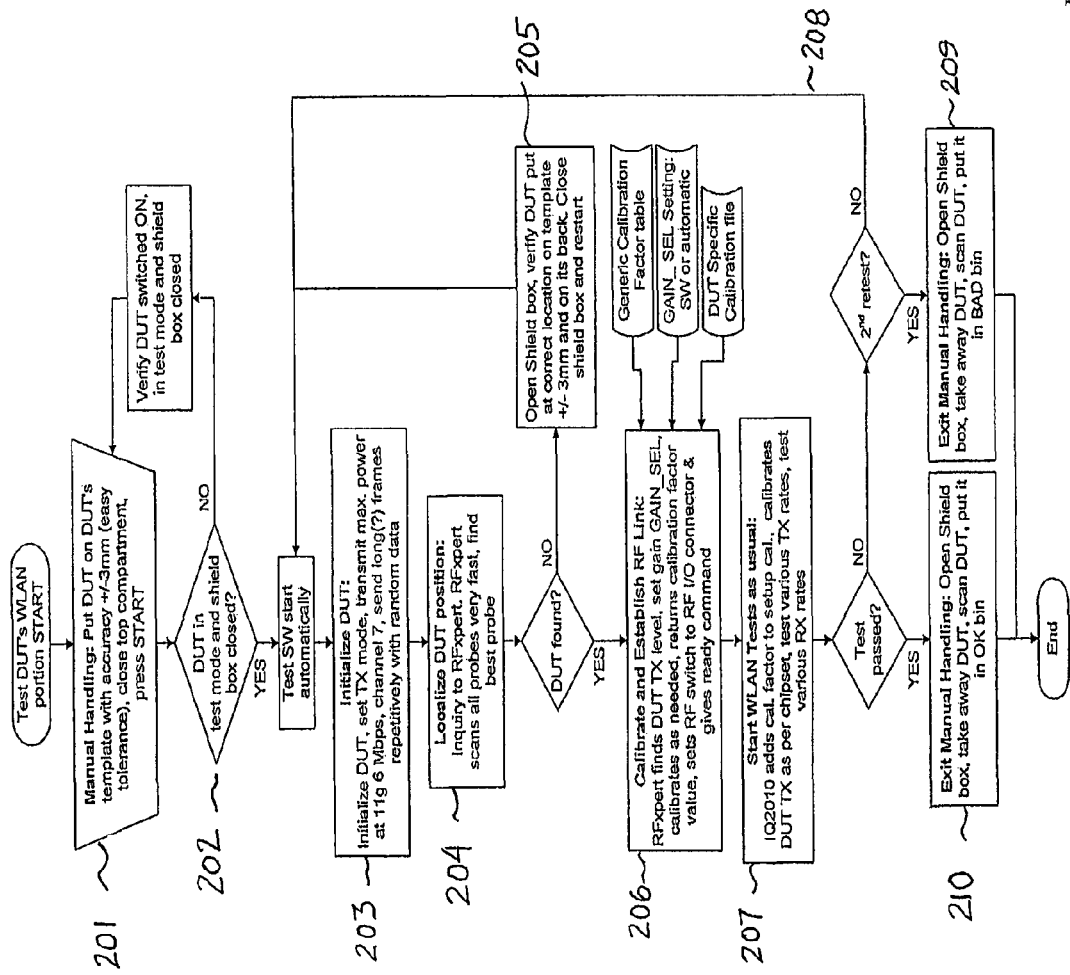
FIG. 2 shows a schematic flowchart of one embodiment of a method for testing a DUT using the test station of the present invention.

Stage H: DUT Testing. Once the station (5) has been satisfactorily calibrated, it may be used to test DUTs. One embodiment of the testing process is shown in FIG. 2. The DUT (in this case a WLAN DUT) is manually positioned on the scanner (10) surface so that the DUT antenna can communicate signals to and from the array of antenna probes (101) (step 201). The scanner (10) has template outlines for different DUTs drawn on its surface to facilitate proper placement of the DUT. No physical connection between the station (5) and the DUT is made. Bi-directional communication to or from the DUT is provided by a wireless protocol. Optionally, the DUT may be connected by a power or digital connection wire that provides power supply and/or permits bi-directional communication. Bi-directional communication in wireless or wired mode means initialisation, starting the test, reading results, etc. Preliminary checks may be made on the DUT and the station (5) itself. It is verified that power is connected to the DUT and that any shield box (11) is closed (step 202). The DUT is initialized in a transmit mode, and is made to transmit random data at maximum power on a suitable channel and data rate (step 203). The scanner (10) queries each of the antenna probes (101) in the antenna array and chooses a single probe which is receiving a strong signal from the DUT (step 204). If the array of antenna probes (101) is unable to detect the DUT, then the shield box is opened, and it is verified that the DUT is properly located in the array of antenna probes (101) (step 205). Conversely, if the array of antenna probes (101) is able to detect the DUT, then the scanner (10) establishes a wireless link to the DUT, and the station (5) sets a gain level, reads calibration files for the station (5) and the DUT type, calibrates as needed, sets the RF switch to the RF I/O connector and signals that the scanner (10) is ready for continued testing (step 206). Standard WLAN testing may then proceed, wherein the test module (14) adds a calibration factor to the setup calibration, calibrates the DUT transmit function in accordance with the DUT chipset, and proceeds to test various transmit and receive rates (step 207). If the DUT fails the test, the test can be repeated in accordance with steps 203 through 207 (path 208), or the DUT can be removed from the shield box, scanned for identification purposes and allocated to a bin of "bad" devices (step 209). If the DUT passes the test, the DUT is removed from the shield box, scanned for identification purposes and allocated to a bin of "OK" devices (step 210).

Switching from one DUT to another of a different type is accomplished by switching test software in the test computer (15). This station (5) can accommodate generic testing and calibration of most single-input, single-output (SISO) WiFi and Bluetooth devices. In one embodiment, any DUT with high or weak transmitter DUTs from +34 dBm EIRP down to −22 dBm EIRP, whether WiFi or Bluetooth in the 2.4-2.5 GHz band, and +28 dBm EIRP down to −13 dBm EIRP for 802.11 a/n in the 5-6 GHz band can be tested.

As will be apparent to those skilled in the art, various modifications, adaptations and variations of the foregoing specific disclosure can be made without departing from the scope of the invention claimed herein.

What is claimed is:

1. A test station for testing a wireless device in transmit mode, the test station comprising:
   (a) a signal generator for generating a conducted calibration signal;
   (b) a calibrator comprising at least one calibrator antenna conductively connected to the signal generator for wirelessly transmitting the calibration signal;
   (c) a wireless scanner comprising at least one receiving antenna for wirelessly receiving the calibration signal;
   (d) a signal analyzer conductively connected to the receiving antenna for receiving and measuring the power level of the calibration signal;
   (e) a computer comprising:
      (i) a memory for storing a calibration signal file encoding for a target transmit power level of the calibration signal at the calibrator antenna, and a set of program instructions implementing a method comprising the steps of:
         providing a signal path comprising a conducted path from the signal generator to the calibrator antenna, a wireless path from the calibrator antenna to the receiving antenna, and a conducted path from the receiving antenna to the signal analyzer;
         providing a calibration signal script encoding for a calibration signal having a target transmit power level at the calibrator antenna;
         using the signal generator to generate the calibration signal through the signal path;
         using the signal analyzer to measure the power level of the calibration signal; and
         correlating the target transmit power level of the calibration signal to the measured power level of the calibration signal;
      (ii) a processor operatively connected to the memory, the signal generator, and the signal analyzer, the processor configured for executing the set of program instructions.

2. The test station of claim 1 wherein the calibrator may be selectively positioned on or away from the wireless scanner.

3. The test station of claim 1 wherein the calibrator further comprises an enclosure for protecting the calibrator antenna.

4. The test station of claim 1 wherein the calibrator antenna is conductively connected to the signal generator via a calibrator signal path having:

(a) a port that may be selectively conductively connected to the signal analyzer;

(b) a calibrator antenna switch for selectively connecting the calibrator antenna to and disconnecting the port from the calibrator signal path, or disconnecting the calibrator antenna from and connecting the port to the calibrator signal path.

5. The test station of claim 4 wherein the calibrator antenna switch is operatively connected to the computer.

6. The test station of claim 1 wherein the wireless scanner comprises a a near-field scanner.

7. The test station of claim 1 wherein the memory storing the calibration signal file is modifiable.

8. The test station of claim 1 wherein the calibration signal script additionally specifies one or more of the following parameters of the calibration signal: frequency; modulation and data rate; error vector magnitude; spectral mask and flatness; occupied bandwidth; phase noise; I-Q imbalance; clock frequency offset; center frequency leaking; or timing.

9. A test station for testing a wireless device in receive mode, the test station comprising:

(a) a signal generator for generating a conducted calibration signal;

(b) a wireless scanner comprising at least one transmitting antenna conductively connected to the signal generator for wirelessly transmitting the calibration signal;

(c) a calibrator comprising at least one calibrator antenna for wirelessly receiving the calibration signal;

(d) a signal analyzer conductively connected to the calibrator antenna for receiving and measuring the power level of the calibration signal;

(e) a variably controllable generator amplifier or attenuator operatively connected to the signal generator for varying the amplitude of the calibration signal generated by the signal generator;

(f) a variably controllable analyzer amplifier or attenuator operatively connected to the signal analyzer for setting the amplitude of the calibration signal received by the signal analyzer;

(g) a bit error detector operatively connected to the signal analyzer for measuring the BER of the calibration signal received by the signal analyzer;

(h) a computer comprising:

(i) a memory for storing a calibration signal file encoding for a target receive power level and a corresponding target BER of the calibration signal at the signal analyzer, and a set of program instructions implementing a method comprising the steps of:

providing a signal path comprising a conducted path from the generator to the transmitting antenna, a wireless path from the transmitting antenna to the calibrator antenna, and a conducted path from the calibrator antenna to the signal analyzer;

providing a calibration signal script encoding for a calibration signal having a target receive power level and a corresponding target BER at the signal analyzer;

using the signal generator to generate the calibration signal through the signal path;

setting the power level of the calibration signal received at the signal analyzer to the target receive power level;

measuring the BER of the calibration signal received at the signal analyzer;

as necessary, varying the power level of the calibration signal generated by the signal generator to converge the measured BER to the target BER;

correlating the target receive power level and the target BER to the power level of the calibration signal generated by the signal generator at which the measured BER converges to the target BER; and (ii) a processor operatively connected to the memory, the signal generator, the signal analyzer, the generator amplifier or attenuator, the analyzer amplifier or attenuator, and the bit error detector, the processor configured for executing the set of program instructions.

10. The test station of claim 9 wherein the calibrator may be selectively positioned on or away from the wireless scanner.

11. The test station of claim 9 wherein the calibrator further comprises an enclosure for protecting the calibrator antenna.

12. The test station of claim 9 wherein the memory storing the calibration signal file is modifiable.

13. The test station of claim 9 the calibration signal script additionally specifies one or more of the following signal parameters of the calibration signal: frequency; modulation and data rate; error vector magnitude; spectral mask and flatness; occupied bandwidth; phase noise; I-Q imbalance; clock frequency offset; center frequency leaking; or timing.

14. The test station of claim 9 wherein the wireless scanner comprises a near-field scanner.

\* \* \* \* \*